United States Patent
Zhang et al.

(10) Patent No.: US 11,862,087 B2
(45) Date of Patent: Jan. 2, 2024

(54) DISPLAY DEVICE AND CONTROL METHOD THEREFOR

(71) Applicant: Wuhan Tianma Micro-Electronics Co., Ltd., Wuhan (CN)

(72) Inventors: Ruyue Zhang, Kanagawa (JP); Genshiro Kawachi, Kanagawa (JP)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 17/939,592

(22) Filed: Sep. 7, 2022

(65) Prior Publication Data

US 2023/0070610 A1 Mar. 9, 2023

(30) Foreign Application Priority Data

Sep. 9, 2021 (JP) .................................. 2021-146648
May 27, 2022 (JP) .................................. 2022-086635

(51) Int. Cl.
G09G 3/3233 (2016.01)
G09G 3/3291 (2016.01)
G11C 19/28 (2006.01)

(52) U.S. Cl.
CPC ......... *G09G 3/3233* (2013.01); *G09G 3/3291* (2013.01); *G09G 2300/043* (2013.01); *G09G 2310/0286* (2013.01); *G09G 2310/08* (2013.01); *G09G 2320/0626* (2013.01); *G09G 2360/16* (2013.01); *G11C 19/28* (2013.01)

(58) Field of Classification Search
None
See application file for complete search history.

(56) References Cited

U.S. PATENT DOCUMENTS

| | | |
|---|---|---|
| 2005/0057581 A1 | 3/2005 | Horiuchi et al. |
| 2006/0055335 A1 | 3/2006 | Shingai et al. |
| 2009/0021287 A1* | 1/2009 | Jang ..................... G09G 3/3233 327/109 |
| 2010/0079361 A1* | 4/2010 | Lee ...................... G09G 3/3233 345/77 |
| 2016/0275865 A1 | 9/2016 | Bi et al. |
| 2017/0352314 A1 | 12/2017 | Matsui et al. |
| 2020/0302875 A1* | 9/2020 | Park ..................... G09G 3/3275 |
| 2022/0199040 A1* | 6/2022 | Kawachi .............. G09G 3/3291 |
| 2022/0208122 A1* | 6/2022 | Shimoda .............. G09G 3/3291 |

\* cited by examiner

*Primary Examiner* — Dorothy Harris
(74) *Attorney, Agent, or Firm* — NIXON & VANDERHYE

(57) ABSTRACT

A display device includes a plurality of pixels and a control circuit configured to control brightness of the plurality of pixels. Each of the plurality of pixels includes a light-emitting element and a pixel circuit configured to control light emission of the light-emitting element. The pixel circuit includes a driving transistor configured to supply electric current to the light-emitting element, and a storage capacitor configured to store voltage to control the electric current to be supplied by the driving transistor to the light-emitting element. The control circuit is configured to determine a statistic of brightness of pixels specified by one or more video frames with a predetermined method, determine a length of a threshold compensation period for which the storage capacitor applies threshold compensation to the driving transistor based on the statistic, and control the pixel circuit based on the threshold compensation period.

13 Claims, 18 Drawing Sheets

TRUTH TABLE

| SET | RST | Q |
|-----|-----|---|
| L | L | L |
| H | L | H (HOLD) |
| L | H | L |
| H | H | L (NOT ALLOWED) |

TRUTH TABLE

| STV1 | STRIM | Q |
|---|---|---|
| L | L | L |
| H | L | H (HOLD) |
| L | H | L |
| H | H | L |

FIG. 17

| COMPENSATION PERIOD | DATA VOLTAGE | | | | | | |
|---|---|---|---|---|---|---|---|
| | LUMINOUS INTENSITY LEVEL | 1 | 32 | 48 | 64 | 127 | 200 | 255 |
| 1H | | V11 | V132 | V148 | ............ | | | |
| 3H | | | V332 | | | | | |
| 5H | | | V532 | | | | | |
| .. | | | ---- | | | | | |

DATA VOLTAGE ADJUSTMENT TABLE

DISPLAY DEVICE AND CONTROL METHOD THEREFOR

CROSS-REFERENCE TO RELATED APPLICATIONS

This non-provisional application claims priority under 35 U.S.C. § 119(a) on Patent Application No. 2021-146648 filed in Japan on Sep. 9, 2021 and Patent Application No. 2022-086635 filed in Japan on May 27, 2022, the entire contents of which are hereby incorporated by reference.

BACKGROUND

This disclosure relates to a display device and a control method therefor.

An organic light-emitting diode (OLED) element is a current-driven self-light-emitting element and therefore, does not need a backlight. In addition to this, the OLED element has advantages for achievement of low power consumption, wide viewing angle, and high contrast ratio; it is expected to contribute to development of flat panel display devices.

An active-matrix (AM) OLED display device includes transistors for selecting pixels and driving transistors for supplying electric current to the pixels. The transistors in an OLED display device are thin-film transistors (TFTs); commonly, low-temperature polysilicon (LTPS) TFTs and/or oxide semiconductor TFTs are used.

The TFTs have variations in their threshold voltage and charge mobility. Since the driving transistors determine the light emission intensity of the OLED display device, their variations in electrical characteristics could cause a problem. Hence, a typical OLED display device includes an adjustment circuit for compensating for the variations and shifts of the threshold voltage of the driving transistors.

SUMMARY

An aspect of this disclosure is a display device including: a plurality of pixels; and a control circuit configured to control brightness of the plurality of pixels. Each of the plurality of pixels includes: a light-emitting element; and a pixel circuit configured to control light emission of the light-emitting element. The pixel circuit includes: a driving transistor configured to supply electric current to the light-emitting element; and a storage capacitor configured to store voltage to control the electric current to be supplied by the driving transistor to the light-emitting element. The control circuit is configured to: determine a statistic of brightness of pixels specified by one or more video frames with a predetermined method; determine a length of a threshold compensation period for which the storage capacitor applies threshold compensation to the driving transistor based on the statistic; and control the pixel circuit based on the threshold compensation period.

An aspect of this disclosure is a control method for a display device. The display device includes a plurality of pixels each including a light-emitting element and a pixel circuit configured to control light emission of the light-emitting element. The pixel circuit includes a driving transistor configured to supply electric current to the light-emitting element and a storage capacitor configured to store voltage to control the electric current to be supplied by the driving transistor to the light-emitting element. The control method includes: determining a statistic of brightness of pixels specified by a video frame with a predetermined method; determining a length of a threshold compensation period for which the storage capacitor applies threshold compensation to the driving transistor based on the statistic; and controlling the pixel circuit based on the threshold compensation period.

It is to be understood that both the foregoing general description and the following detailed description are exemplary and explanatory and are not restrictive of this disclosure.

BRIEF DESCRIPTION OF THE DRAWINGS

FIG. 17 is a truth table for the trimming controller in FIG. 16;

EMBODIMENTS

Figure 1:
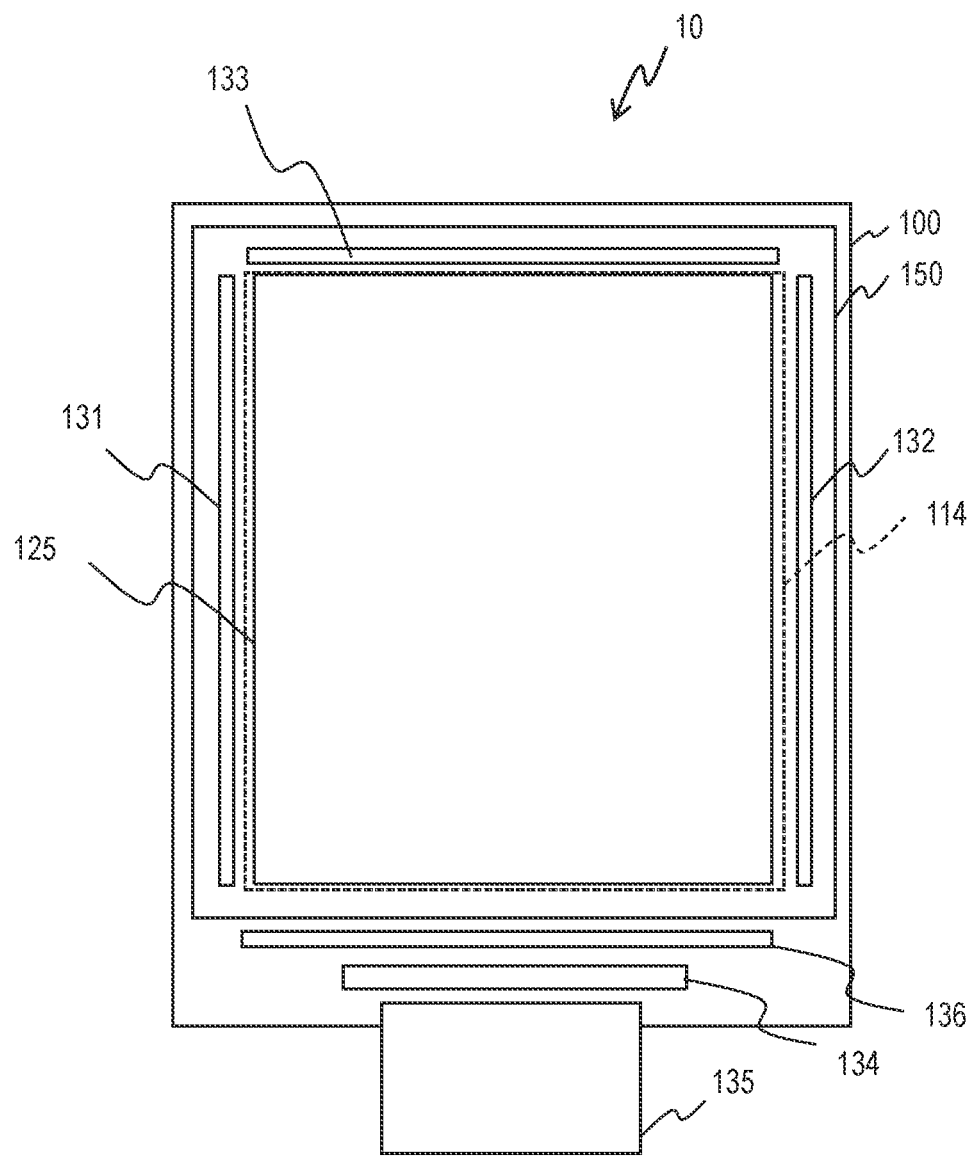
FIG. 1 schematically illustrates a configuration example of an OLED display device.

Hereinafter, embodiments will be described with reference to the drawings. Elements common to the drawings are denoted by the same reference signs and some elements in the drawings are exaggerated in size or shape for clear understanding of the description.

Disclosed in the following are configurations of a circuit for generating and outputting control signals for the pixel circuits of an electro-luminescent display device. The electro-luminescent display device is a display device utilizing light-emitting elements that emit light in response to driving current, like an organic light-emitting diode (OLED) display device. The OLED display device may exhibit variations in brightness among the pixels included in display region.

The variations of brightness are caused by the characteristics of threshold voltage compensation applied by the pixel circuits to the driving transistors. The inventors' research revealed that the length of the threshold compensation period that minimizes the variations of brightness in the display region is different depending on the value of the electric current that flows through driving transistors (the brightness of light-emitting elements).

A display device in an embodiment of this specification determines the length of the threshold compensation period for the driving transistors in the pixel circuits based on the brightness of a plurality of pixels included in the display region that are specified in video data. This feature effectively reduces the variations in brightness that change with the brightness of the displayed image.

Embodiment 1

An overall configuration of the display device in an embodiment of this specification is described with reference to FIG. 1. The elements in the drawings may be exaggerated in size or shape for clear understanding of the description. In the following, an organic light-emitting diode (OLED) display device is described as an example of the display device.

FIG. 1 schematically illustrates a configuration example of an OLED display device 10. The OLED display device 10 includes a thin-film transistor (TFT) substrate 100 on which OLED elements (light-emitting elements) are fabricated and a structural encapsulation unit 150 for encapsulating the OLED elements. In the periphery of a cathode electrode region 114 outer than the display region 125 of the TFT substrate 100, control circuits, specifically a scanning driver 131, an emission driver 132, an electrostatic discharge protection circuit 133, a driver IC 134, and a demultiplexer 136, are provided.

The driver IC 134 is connected to the external devices via flexible printed circuits (FPC) 135. The scanning driver 131 drives scanning lines on the TFT substrate 100. The emission driver 132 drives emission control lines to control light emission of pixels. The electrostatic discharge protection circuit 133 saves the elements on the TFT substrate 100 from electrostatic discharge damage. The driver IC 134 is mounted with an anisotropic conductive film (ACF), for example.

The driver IC 134 provides power and control signals including a timing signal to the scanning driver 131 and the emission driver 132 and further, provides power and a data signal to the demultiplexer 136. The demultiplexer 136 outputs output of one pin of the driver IC 134 to d data lines (d is an integer greater than 1) in series. The demultiplexer 136 changes the output data line for the data signal from the driver IC 134 d times per scanning period to drive d times as many data lines as output pins of the driver IC 134.

Figure 2:
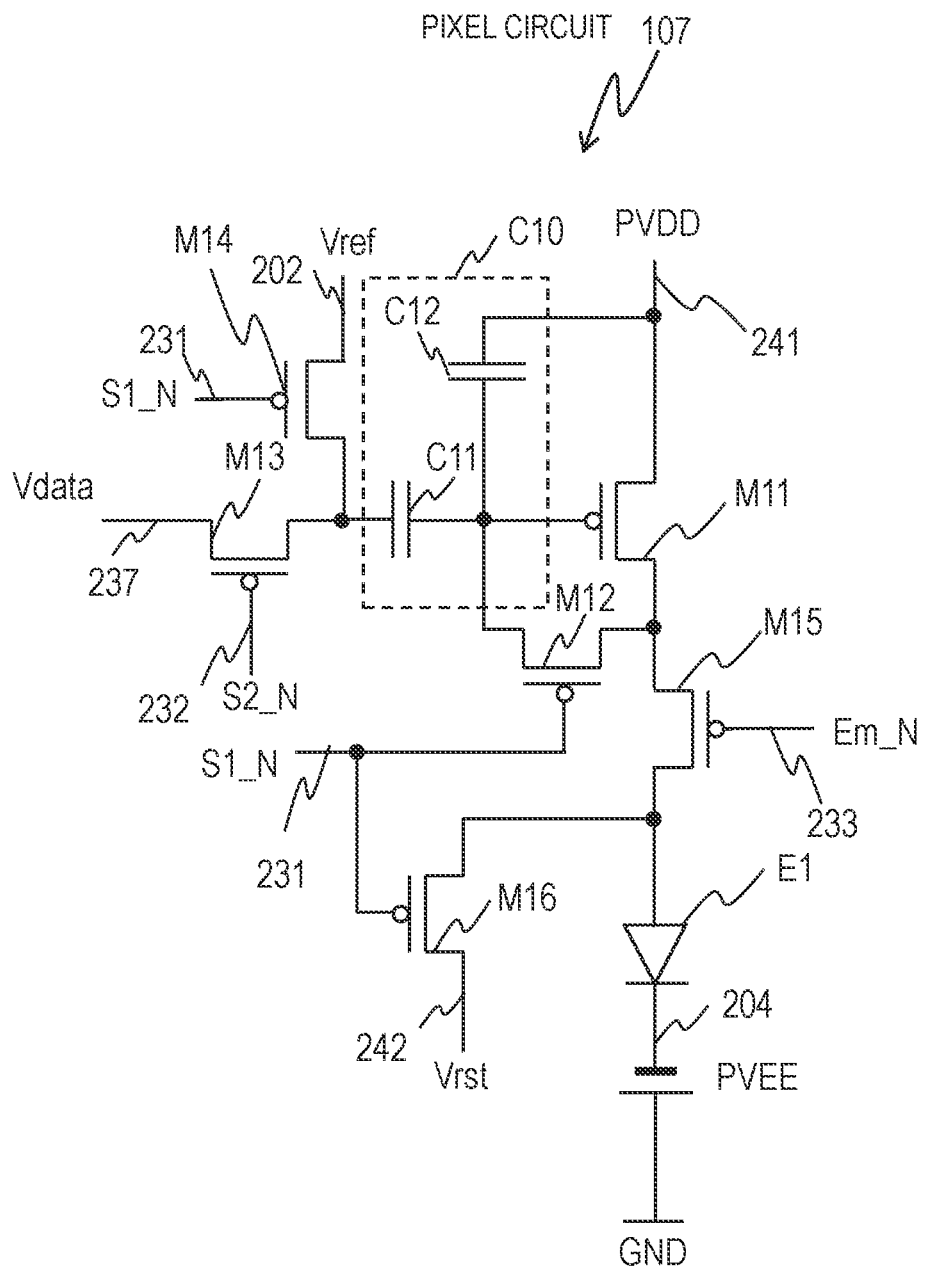
FIG. 2 illustrates a configuration example of a pixel circuit in an embodiment of this specification.

FIG. 2 illustrates a configuration example of a pixel circuit 107 in an embodiment of this specification. The pixel circuit 107 is included in the N-th pixel circuit row (N is an integer). The pixel circuit 107 includes six transistors (TFTs) M11 to M16 each having a gate, a source, and a drain. All transistors M11 to M16 in this example are p-type TFTs.

The transistor M11 is a driving transistor for controlling the amount of electric current to an OLED element E1. The driving transistor M11 controls the amount of electric current to be supplied from an anode power supply for supplying a power supply potential PVDD to the OLED element E1 in accordance with a voltage stored in a storage capacitor C10. The storage capacitor C10 holds a written voltage throughout one frame period. The cathode of the OLED element E1 is connected to a power line 204 for transmitting a power supply potential PVEE from a cathode power supply. The power supply potentials PVDD and PVEE can be supplied from the driver IC 134.

The storage capacitor C10 in the configuration example of FIG. 2 consists of capacitors C11 and C12 connected in series. One end of the storage capacitor C10 is supplied with the anode power supply potential PVDD and another end is connected to the source/drain regions of the switching transistors M13 and M14. Still another end of the storage capacitor C10 is connected to the gate of the driving transistor M11. More specifically, an end of the capacitor C12 is connected to the anode power line 241; an end of the capacitor C11 is connected to the source/drain regions of the switching transistors M13 and M14; and an intermediate node between the capacitors C11 and C12 is connected to the gate of the driving transistor M11.

The voltage of the storage capacitor C10 is a voltage between the gate of the driving transistor M11 and the anode power line 241. The source of the driving transistor M11 is connected to the anode power line 241; the source potential is the anode power supply potential PVDD. Accordingly, the storage capacitor C10 stores the voltage between the gate and the source of the driving transistor M11. In the configuration example of FIG. 2, the capacitor C12 stores the gate-source voltage of the driving transistor M11.

The transistor M15 is a switching transistor for controlling ON/OFF of light emission of the OLED element E1. The source of the transistor M15 is connected to the drain of the driving transistor M11. The transistor M15 switches ON/OFF the current supply to the OLED element E1 connected from its drain. The gate of the transistor M15 is connected to an Em signal line (emission control line) 233 and the transistor M15 is controlled by the emission control signal Em input from the emission driver 132 to its gate.

The transistor M16 works to supply a reset potential Vrst to the anode of the OLED element E1. One end of the source/drain of the transistor M16 is connected to a power line 242 for transmitting the reset potential Vrst and the other end is connected to the anode of the OLED element E1. The reset potential Vrst can be supplied from the driver IC 134.

The gate of the transistor M16 is connected to an S1 signal line 231 and the transistor M16 is controlled by the control signal S1. When the transistor M16 is turned ON by the control signal S1 input from the scanning driver 131 to its gate, the transistor M16 supplies the reset potential Vrst transmitted by the power line 242 to the anode of the OLED element E1.

The transistor M16 also has a function to prevent leak emission by bypassing the current flowing from the power supply PVDD into the OLED element E1 via the transistors M11 and M15 during the reset period, while supplying the reset potential Vrst to the anode of the OLED element E1.

The transistor M12 is a switching transistor for writing a voltage for applying threshold compensation to the driving transistor M11 to the storage capacitor C10 and for resetting the gate potential of the driving transistor M11. The source and the drain of the transistor M12 connect the gate and the drain of the driving transistor M11. Accordingly, when the transistor M12 is ON, the driving transistor M11 is diode-connected.

The transistor M14 is a switching transistor for writing a voltage for applying threshold compensation to the driving transistor M11 to the storage capacitor C10. The transistor M14 controls whether to supply a reference potential Vref to the storage capacitor C10. One end of the source/drain of the transistor M14 is connected to a power line 202 for transmitting the reference potential Vref and the other end is connected to an end of the capacitor C11. The gate of the transistor M14 is connected to the S1 signal line 231 and the transistor M14 is controlled by the control signal S1 input from the scanning driver 131 to its gate.

The transistors M12, M16, and M14 are controlled by the control signal S1. Accordingly, these transistors M12, M16, and M14 are turned ON/OFF simultaneously. During the period where the emission control transistor M15 is ON, these transistors are turned ON to reset the gate potential of the driving transistor M11 and the potential of the storage capacitor C10. After these potentials are reset, the emission control transistor M15 is turned OFF. When the transistors M12 and M14 are ON, the transistor M11 is a diode-connected transistor. A threshold compensation voltage between the power supply potential PVDD and the reference potential Vref is written to the storage capacitor C10.

The transistor M13 is a switching transistor for selecting a pixel circuit to be supplied with a data signal and writing the data signal (data signal voltage) to the storage capacitor C10. One end of the source/drain of the transistor M13 is connected to a data line 237 for transmitting a data signal Vdata and the other end is connected to the storage capacitor C10, more specifically, an end of the capacitor C11.

The gate of the transistor M13 is connected to an S2 signal line 232 for transmitting a control signal S2 for selecting a pixel circuit row to write a data signal. The transistor M13 is controlled by the control signal S2 supplied from the scanning driver 131. When the transistor M13 is ON, the transistor M13 supplies the data signal Vdata supplied from the driver IC 134 through the data line 237 to the storage capacitor C10.

Figure 3:
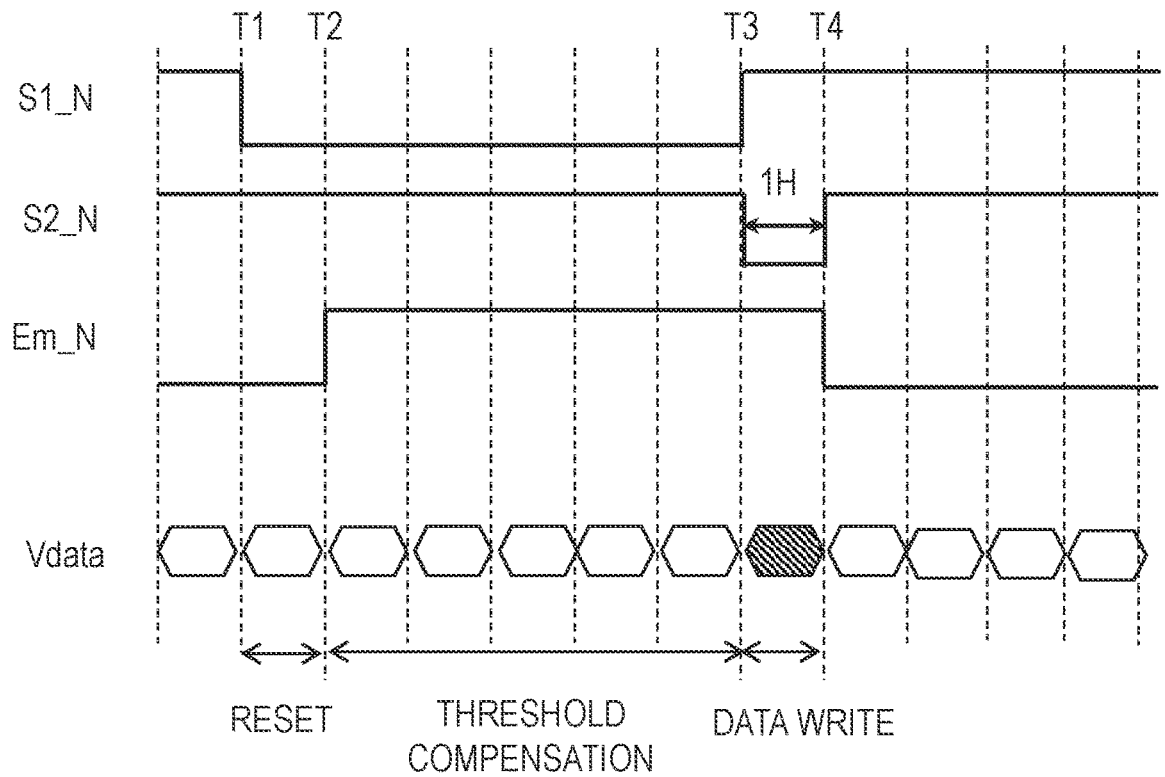
FIG. 3 is an example of the timing chart of signals for controlling a pixel circuit.

FIG. 3 is an example of the timing chart of the signals for controlling the pixel circuit 107 in FIG. 2. FIG. 3 is a timing chart to write a threshold compensation voltage for the driving transistor M11 and a data signal Vdata to a pixel circuit in the N-th pixel circuit row. Specifically, FIG. 3 illustrates temporal variation in one frame of the selection signals S1_N and S2_N for selecting the N-th pixel circuit row to write a data signal Vdata, the emission control signal Em_N for the N-th pixel circuit row, and the data signal Vdata. FIG. 3 shows variation in signal potential level of those signals. A selection signal is a kind of control signal and can be referred to as scanning signal. The selection signal S1 is a first selection signal and the selection signal S2 is a second selection signal.

The period of 1H in the timing chart of FIG. 3 is a period to write a data signal Vdata to a pixel circuit and a period where the selection signal S2 is Low. A threshold compensation period is not shorter than 1H and in the example of FIG. 3, 5H.

At a time T1, the selection signal S1_N changes from High to Low. The transistors M12, M14, and M16 turn ON in response to the change of the selection signal S1_N. Since the emission control signal Em_N is Low at the time T1, the transistor M15 is ON.

Since the transistors M12 and M14 to M16 are ON, the reset potential Vrst is supplied to the anode of the OLED element E1 and in addition, to the gate of the driving transistor M11. At a time T2, the emission control signal Em_N changes from Low to High. The period from the time T1 to the time T2 is a period to reset the gate voltage of the driving transistor M11 and the storage capacitor C10.

The potential levels of the signals S1_N, S2_N, and Em_N are maintained from the time T2 to a time T3. The transistors M12, M14, and M16 are ON and the other transistors including the transistor M15 are OFF. A threshold compensation voltage is written to the storage capacitor C10 during this period from the time T2 to the time T3. The period from the time T2 to the time T3 is a threshold compensation period and has a length of 5H.

At the time T3, the selection signal S2_N changes from High to Low. The selection signal S1_N changes from Low to High. The transistors M12, M14, and M16 turn OFF in response to the change of the selection signal S1_N. The selection signal S1_N is maintained to be High after the time T3.

Further, the transistor M13 turns from OFF to ON in response to the change of the selection signal S2_N. As a result, a data signal Vdata starts being written to the storage capacitor C10. At a time T4, the selection signal S2_N changes from Low to High. In response, the transistor M13 turns from ON to OFF to end the data write to the N-th pixel circuit row. The period from the time T3 to the time T4 is a period to write data to the N-th pixel circuit row and has a length of 1H. The selection signal S2_N is maintained to be High after the time T4.

At the time T4, the emission control signal Em_N changes from High to Low. In response, the transistor M15 turns from OFF to ON. As a result, driving current is supplied to the OLED element E1 and the OLED element E1 starts emitting light.

Figure 4:
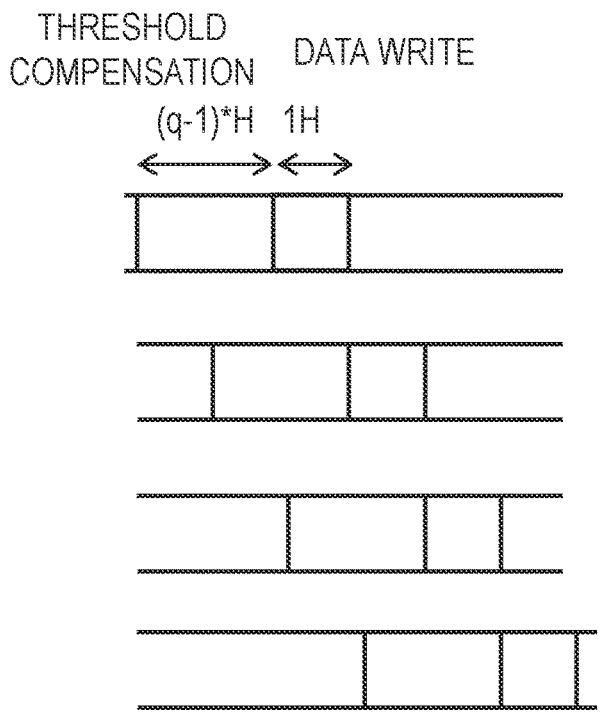
FIG. 4 schematically illustrates a relation among threshold compensation periods and data write periods in four consecutive pixel circuit rows.

FIG. 4 schematically illustrates a relation among threshold compensation periods and data write periods in four consecutive pixel circuit rows. In each pixel circuit row, a data write period follows a threshold compensation period. The lengths of the data write periods and the threshold compensation periods are common to the pixel circuit rows. In the examples illustrated in FIGS. 3 and 4, the length of a data write period is 1H and the length of a threshold compensation period is (q−1)*H, where q is an integer greater than 1. For more appropriate threshold compensation, the value of q is determined to be an integer greater than 2. In the example described with reference to FIG. 3, the value of q is 6.

The length of the threshold compensation period changes with the length of the selection signal S1_N. As described above, the length of the period where the selection signal S1_N is Low is qH and the length of the threshold compensation period is (q−1)*H. The OLED display device 10 can dynamically change the value of q to attain an appropriate threshold compensation period. As will be described later, the length of the threshold compensation period does not need to be an integral multiple of 1H.

As illustrated in FIG. 4, data signals are serially written to the pixel circuit rows. The data write period for a pixel circuit row starts immediately after the data write period for the previous row has ended. The data write periods for different pixel circuit rows never overlap. The threshold compensation period for a pixel circuit row overlaps the threshold compensation period and the data write period for the previous pixel circuit row. A threshold compensation period can overlap data write periods for some preceding pixel circuit rows from the immediately preceding pixel circuit row.

Figure 5:
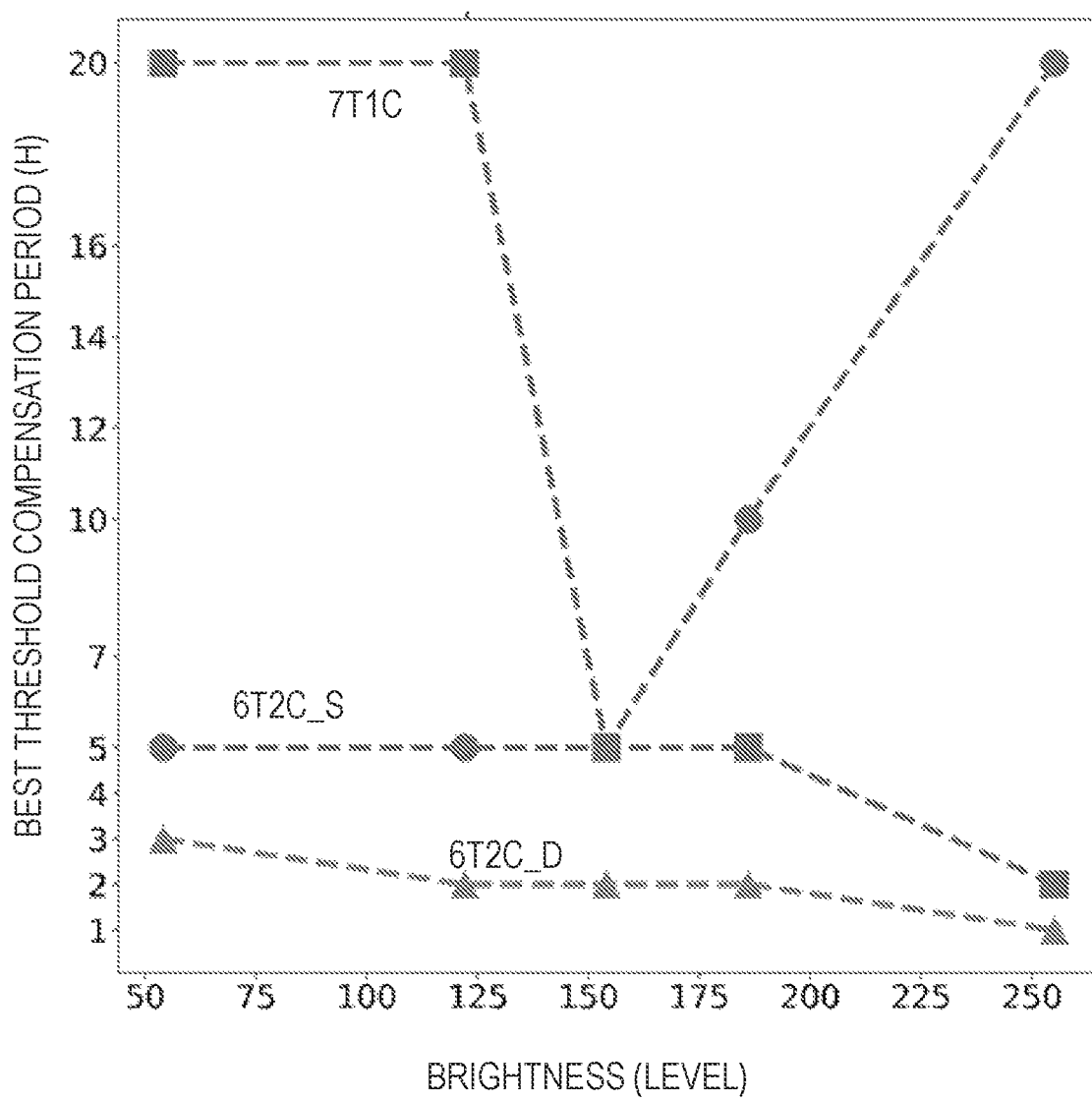
FIG. 5 illustrates relations between the average brightness in a video frame and the best threshold compensation period in different pixel circuits.

Hereinafter, a method of dynamically changing the threshold compensation period for the pixels is described. The threshold compensation period that minimizes the variations in brightness of a display region 125 differs depending on the brightness of the display region 125. FIG. 5 illustrates relations between the average brightness of a video frame and the best threshold compensation period in different pixel circuits. FIG. 5 provides results of simulation by principal component analysis (PCA).

In the graph of FIG. 5, the horizontal axis represents the average brightness of the pixels according to a video frame and the vertical axis represents the best length for the threshold compensation period. More specifically, the horizontal axis represents the average of the brightness expressed by a luminous intensity level and the vertical axis represents the threshold compensation period expressed by a multiple of 1H period. The 1H period is 4.2 μs. One pixel can display a dot in one color at different brightness levels. Typically, each pixel displays a red, blue, or green dot; it can also be referred to as subpixel.

FIG. 5 provides analysis results on three different examples of pixel circuits. The 7T1C pixel circuit includes seven transistors and one capacitive element. The 6T2C_D pixel circuit and the 6T2C_S pixel circuit both include six transistors and two capacitive elements but they are different in connection of the elements therein. The pixel circuit 107 illustrated in FIG. 2 is a 6T2C_D pixel circuit.

As illustrated in FIG. 5, the best length for the threshold compensation period changes with the brightness of the display region 125 in any pixel circuit. The inventors' research revealed that the best threshold compensation period differs depending on various statistics of the brightness of the display region 125, for example, not only the average of the brightness of the display region 125 but also the mode of the brightness and the average of the brightness of a specific color.

The OLED display device 10 in an embodiment of this specification dynamically changes the length of the threshold compensation period in the display region 125 during a period where it is displaying a picture. The period where the display device is displaying a picture is a period where the display device is displaying a picture composed of successive video frames.

For example, the OLED display device 10 updates the threshold compensation period for every video frame or every predetermined number of video frames. The OLED display device 10 calculates a predetermined statistic about the brightness of the pixels specified by the video frame and determines the threshold compensation period for the video frame or its subsequent video frames based on the statistic. As a result, the variations in brightness of every image displayed on the screen decrease, raising the picture quality.

Figure 6:
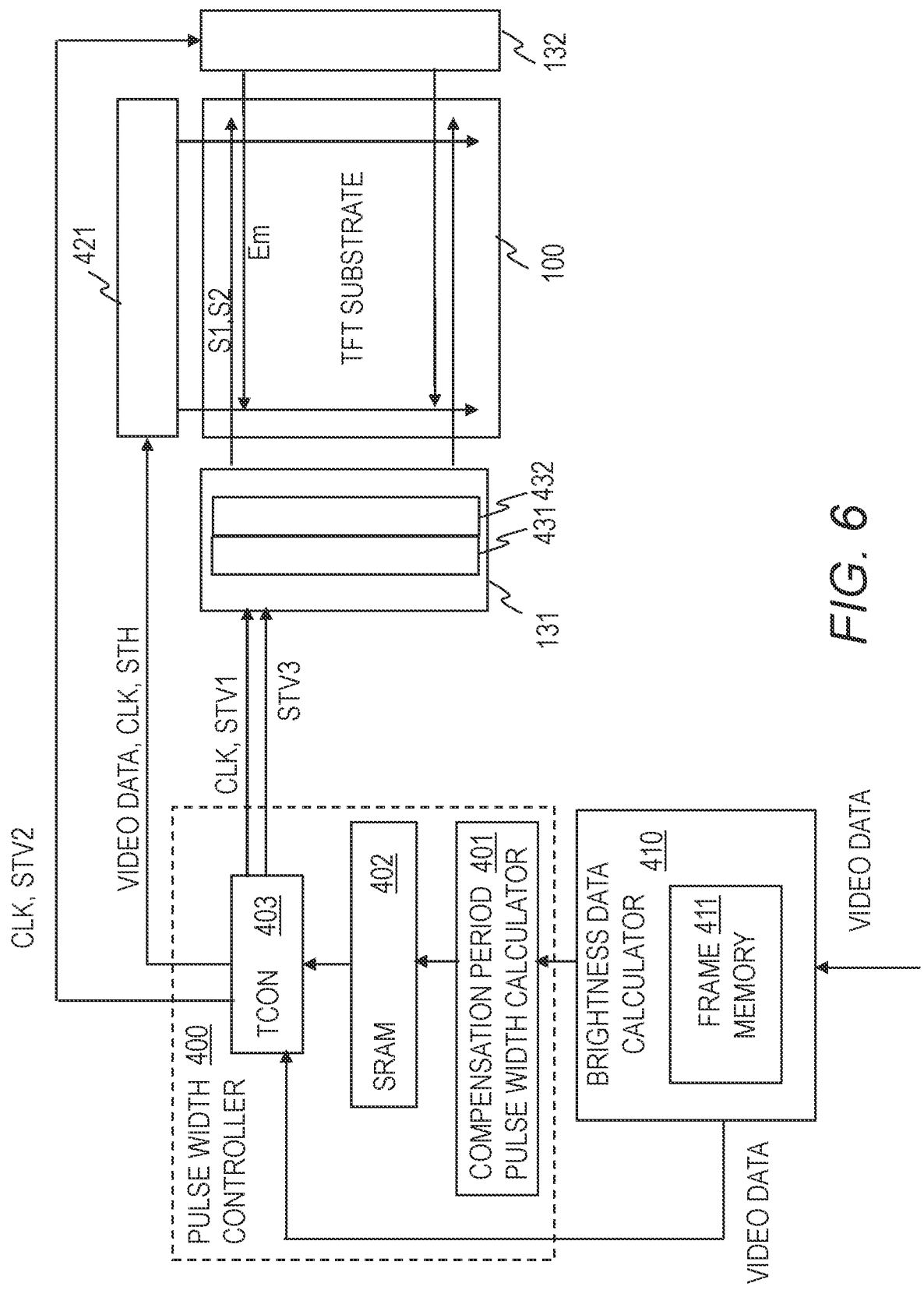
FIG. 6 illustrates an example of the functional configuration of an OLED display device that dynamically changes the threshold compensation period.

FIG. 6 illustrates an example of the functional configuration of an OLED display device 10 in an embodiment of this specification that dynamically changes the threshold compensation period. The OLED display device 10 includes a brightness data calculator 410 and a pulse width controller 400. The brightness data calculator 410 and the pulse width controller 400 can be included in the driver IC 134 or an external circuit (not shown in FIG. 6).

The brightness data calculator 410 receives video data from an external circuit. The brightness data calculator 410 includes a frame memory 411. The video data is a sequence of video frames; the brightness data calculator 410 successively stores received video frames to the frame memory 411. The brightness data calculator 410 calculates a statistic of the brightness specified by the video frames. The statistic can be calculated on each frame or calculated intermittently on some of the video frames.

The statistic to be calculated can be the average brightness, the mode of the brightness, the highest brightness, or the lowest brightness, for example. The average brightness can be the average of the brightness levels assigned to the pixels in the whole or a part of the display region 125 or all or a part of the pixels of a specific color. The mode of the brightness can be the brightness level assigned by a video frame to the largest number of pixels among the brightness levels assigned to all pixels, pixels of a specific color, or pixels in a specific part of the display region 125. The highest brightness and the lowest brightness can be the highest level and the lowest level among the brightness levels assigned by a video frame to all pixels, pixels of a specific color, or pixels in a specific part of the display region 125.

The pulse width controller 400 includes a compensation period pulse width calculator 401, an SRAM 402 of a volatile storage device, and a timing controller (TCON) 403. The compensation period pulse width calculator 401 receives the brightness statistic of a video frame from the brightness data calculator 410. The compensation period pulse width calculator 401 determines a threshold compensation period based on the received brightness statistic.

More specifically, the compensation period pulse width calculator 401 determines the pulse width for the start pulse signal for the S1 selection signals that determines the threshold compensation period. The threshold compensation period is defined with this pulse width. The pulse width calculator 401 can determine the threshold compensation period by consulting a lookup table or calculating with a predefined function. The data indicating a start pulse width or the data indicating a threshold compensation period is stored to the SRAM 402.

The timing controller 403 controls the scanning driver 131, the emission driver 132, and a data driver 421. The data driver 421 is included in the driver IC 134 and outputs data signals in accordance with video data (a video frame) to individual data lines. The demultiplexer 136 and the electrostatic discharge protection circuit 133 are excluded from FIG. 6.

The timing controller 403 acquires video data from the frame memory 411 and further, acquires the data indicating the threshold compensation period (start pulse width) from the SRAM 402. The timing controller 403 generates an internal clock signal and start pulse signals to control the scanning driver 131, the emission driver 132, and the data driver 421. The timing controller 403 further generates video data to be sent to the data driver 421 in accordance with the video data from the external. The timing controller 403 sends the video data (video frame), the clock signal, and a start pulse signal (STH signal) to the data driver 421. The data driver 421 operates in accordance with the clock signal. The data driver 421 outputs data signals specifying brightness of individual pixels in each pixel row according to the video data to the data lines at the times and for the period in accordance with the STH signal.

The timing controller 403 sends the clock signal and two start pulse signals (STV1 signal and STV3 signal) to the scanning driver 131. The scanning driver 131 includes two shift register circuits 431 and 432. For example, the shift register circuit 431 outputs S1 selection signals in accordance with the received clock signal and STV1 signal and the shift register circuit 432 outputs S2 selection signals in accordance with the received clock signal and STV3 signal.

The STV1 signal and the STV3 signal define the length of a Low-state period of the S1 selection signals and the S2 selection signals, respectively. As will be described later, the pulse width controller 400 changes the length of the threshold compensation period by changing the length of the Low-state period of the S1 selection signals.

The timing controller 403 sends the clock signal and a start pulse signal (STV2 signal) to the emission driver 132. The emission driver 132 includes a shift register circuit and outputs emission control signals (Em signals) in accordance with the received clock signal and STV2 signal. The STV2 signal defines the length of a High-state period of the Em signals.

Figure 7:
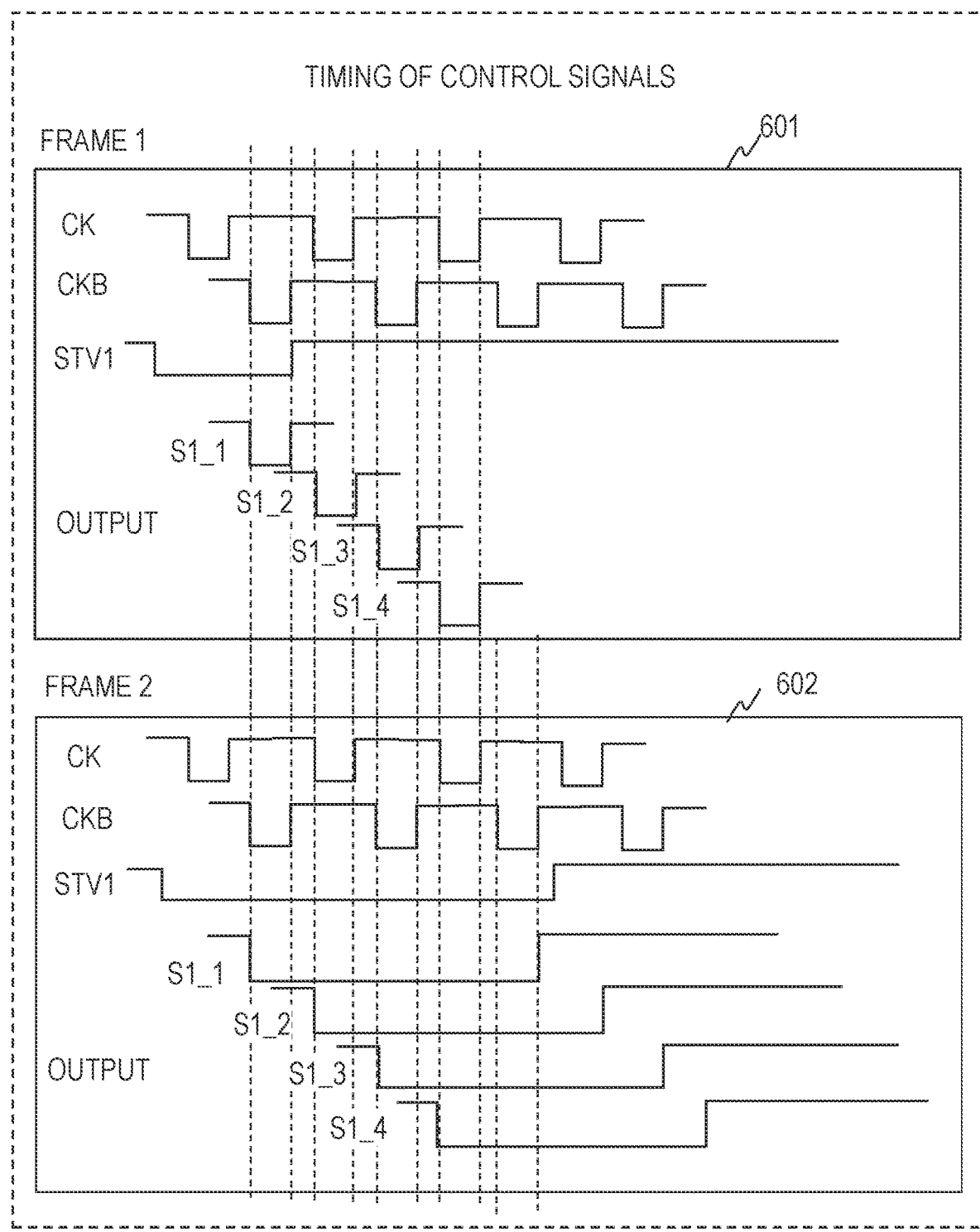
FIG. 7 provides timing charts of S1 selection signals and control signals for generating the S1 selection signals.

In an embodiment of this specification, the pulse width controller 400 changes the length of the threshold compensation period by changing the length of the Low-state period of the S1 selection signals. The length of the emission control signals Em is kept uniform. FIG. 7 provides timing charts of S1 selection signals and the control signals for generating the S1 selection signals. The timing chart 601 illustrates temporal variation of the signals for a video frame 1 and the timing chart 602 illustrates temporal variation of the signals for a video frame 2 different from the video frame 1.

FIG. 7 illustrates temporal variation of two clock signals (CK signal and CKB signal), a start pulse signal (STV1 signal), and S1 selection signals. FIG. 7 includes temporal variation of S1 selection signals S1_1, S1_2, S1_3, and S1_4 for four consecutive pixel rows by way of example.

An S1 selection signal is generated based on two clock signals (the CK signal and the CKB signal) and the STV1 signal. The CK signal and the CKB signal are generated by the scanning driver 131 based on the CLK signal from the timing controller 403. The CK signal and the CKB signal have the same pulse width (the length of a Low-state period) and their phases are shifted by a half cycle.

As illustrated in FIG. 7, the pulse width of the start pulse signal (STV1 signal) for the S1 selection signals or the length of a Low-state period of the STV1 signal defines the pulse width of the S1 selection signals or the length of a Low state of the S1 selection signals. When the pulse width of the S1 selection signals is shorter, the threshold compensation period is shorter; when the pulse width of the S1 selection signals is longer, the threshold compensation period is longer.

In the timing chart 601 for the frame 1, the width from the first falling edge to the last rising edge of the CKB signal in the period where the STV1 signal is Low becomes the pulse width (the length of a Low-state period) of the S1 selection signals. The pulse width of the S1 selection signals for the frame 1 corresponds to one pulse of the CKB signal.

The pulse of the S1 selection signal S1_1 for the first pixel row starts with the first rising edge of the CKB signal within the period where the STV1 signal is Low. The scanning driver 131 starts outputting the S1 selection signals for the second and the subsequent pixel rows in response to the falling edges of either the CK signal or the CKB signal. The pulse widths of the S1 selection signals for all pixel rows are the same.

As to the frame 2, the width from the first falling edge to the last rising edge of the CKB signal within the period where the STV1 signal is Low becomes the pulse width (the length of a Low-state period) of the S1 selection signals, like in the frame 1. In the timing chart 602 for the frame 2, the pulse width of the STV1 signal is longer than the pulse width of the STV1 signal in the timing chart 601 for the frame 1. Accordingly, the pulse width of the S1 selection signals for the frame 2 is longer than the pulse width of the S1 selection signals for the frame 1. In the example of FIG. 7, the pulse width of the S1 selection signals for the frame 2 corresponds to three pulses of the CKB signal.

A pulse of the S1 selection signal S1_1 for the first pixel row starts in response to the first falling edge of the CKB signal within the period where the STV1 signal is Low. The scanning driver 131 starts outputting the S1 selection signals for the second and the subsequent pixel rows in response to the falling edges of either the CK signal or the CKB signal. The pulse widths of the S1 selection signals for all pixel rows are the same.

In the example of FIG. 7, the falling edge of the STV1 signal is synchronized with the frame cycle. The pulse width controller 400 shifts the rising edge of the STV1 signal depending on the brightness of the display region 125 specified by the video frame. The start of a threshold compensation period is synchronized with the frame cycle and the end of the threshold compensation period is shifted back or forth.

In the configuration example described with reference to FIGS. 6 and 7, the scanning driver 131 determines the pulse width of the S1 selection signals or the threshold compensation period in accordance with the pulse width of the start pulse signal sent from the pulse width controller 400. The pulse width controller 400 determines the pulse width of the start pulse signal based on a statistic of the pixels of the display region 125 specified by a video frame. This configuration enables more appropriate threshold compensation depending on the brightness of the pixels of the display region 125 and reduces the variations in brightness within the display region 125.

The above-described example fixes the rising edges and shifts the falling edges of the S1 selection signals to change the period where the S1 selection signal is Low. Another example can be configured to shift the rising edges and fix the falling edges of the S1 selection signals. In that example, the rising edges of the emission control signals Em are shifted in accordance with the shift of the rising edges of the S1 selection signals.

Embodiment 2

Figure 8:
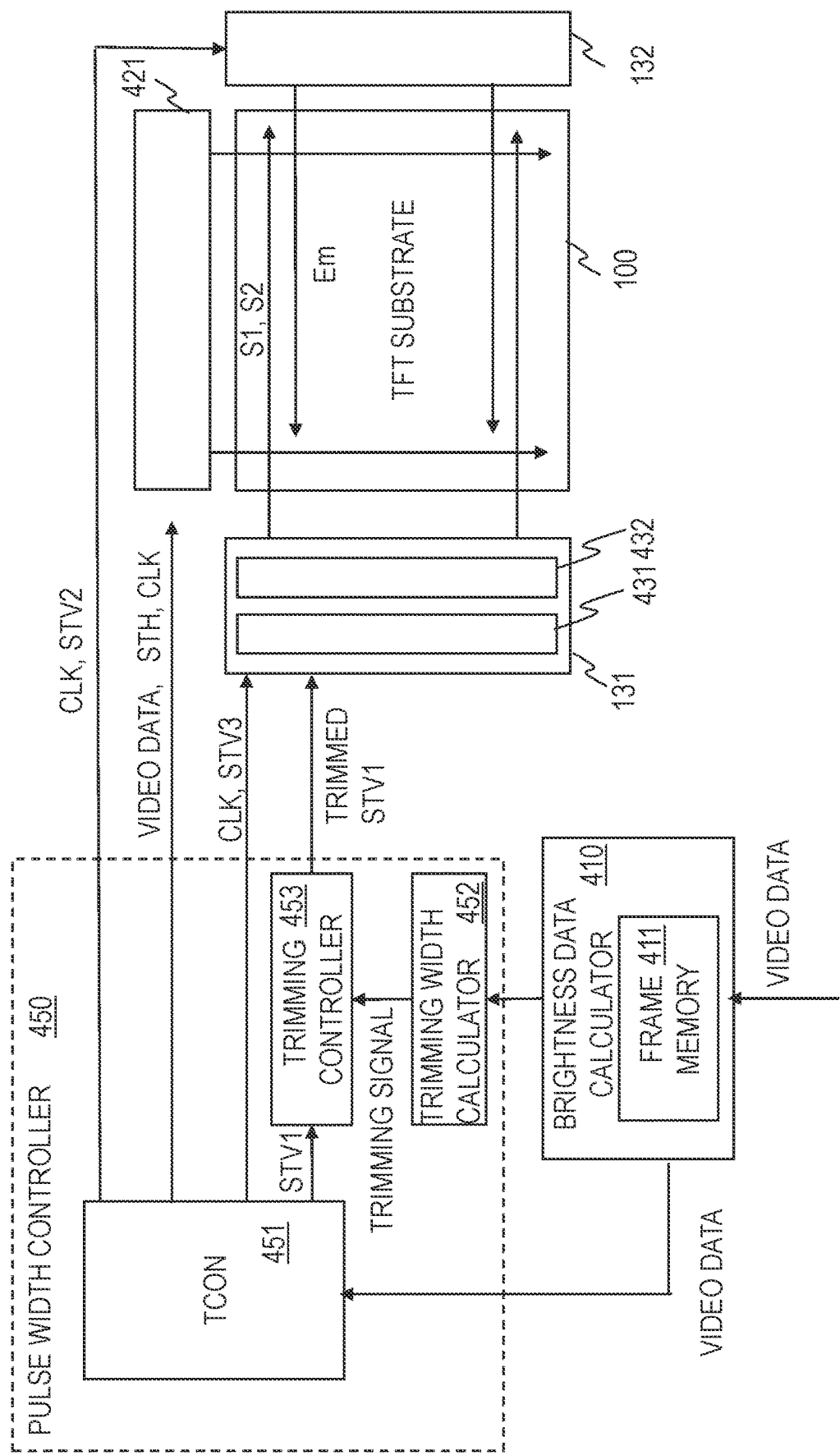
FIG. 8 illustrates an example of the functional configuration of an OLED display device in an embodiment of this specification that dynamically changes the threshold compensation period.

FIG. 8 illustrates an example of the functional configuration of an OLED display device 10 in an embodiment of this specification that dynamically changes the threshold compensation period. In the following, differences from the configuration example illustrated in FIG. 6 are mainly described. The OLED display device 10 includes a pulse width controller 450 in place of the pulse width controller 400 in FIG. 6. The brightness data calculator 410 works in the same manner as the one in the configuration example of FIG. 6.

The pulse width controller 450 includes a timing controller (TCON) 451, a trimming width calculator 452, and a trimming controller 453. Unlike the configuration example of FIG. 6, the timing controller (TCON) 451 generates an STV1 start pulse signal without referencing the brightness statistic of the video frame calculated by the brightness data calculator 410. The pulse width of the STV1 start pulse signal is fixed. The other control signals are generated in the same manner as those in the configuration example of FIG. 6.

The trimming width calculator 452 acquires the brightness statistic of the video frame from the brightness calculator 410. The trimming width calculator 452 determines a threshold compensation period based on the brightness statistic. Specifically, the trimming width calculator 452 determines a trimming width for determining the threshold compensation period. The trimming width defines the threshold compensation period. The trimming width calculator 452 sends a trimming signal specifying the trimming width to the trimming controller 453. The trimming width can be determined by consulting a lookup table or calculating with a predefined function.

The trimming controller 453 acquires the STV1 start pulse signal from the timing controller 451 and acquires the trimming signal from the trimming width calculator 452. The trimming controller 453 trims the pulse of the STV1 start pulse signal in accordance with the trimming signal. As a result, the pulse width of the STV1 start pulse signal is shortened.

Figure 9:
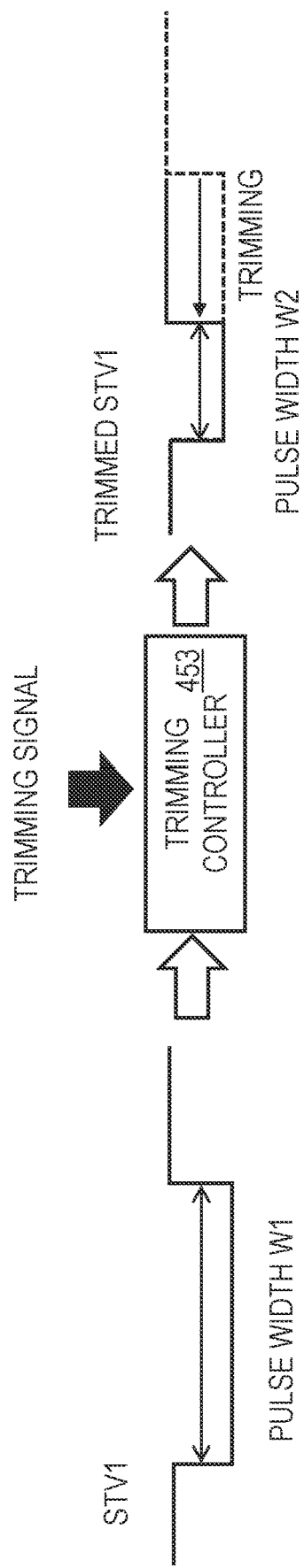
FIG. 9 is a diagram schematically illustrating operation of trimming an STV1 start pulse signal by a trimming controller.

FIG. 9 is a diagram schematically illustrating the operation of trimming the STV1 start pulse signal by the trimming controller 453. An STV1 start pulse signal having a pulse width W1 is input to the trimming controller 453. The trimming controller 453 reduces the pulse width of the STV1 start pulse signal by the trimming width specified by the trimming signal. The STV1 start pulse signal output from the trimming controller 453 has a pulse width W2. The pulse width W2 is shorter than the pulse width W1 by the specified trimming width.

As described above, this configuration example adjusts the pulse width of the STV1 start pulse signal by trimming the STV1 start pulse signal from the timing controller. Hence, the timing controller does not need to have a function to adjust the pulse width of the start pulse and therefore, a conventional timing controller can be used. The pulse width controller 450 can include a function to extend the pulse width of the start pulse signal, instead of or in addition to the function to trim the pulse width of the start pulse signal.

Embodiment 3

Figure 10:
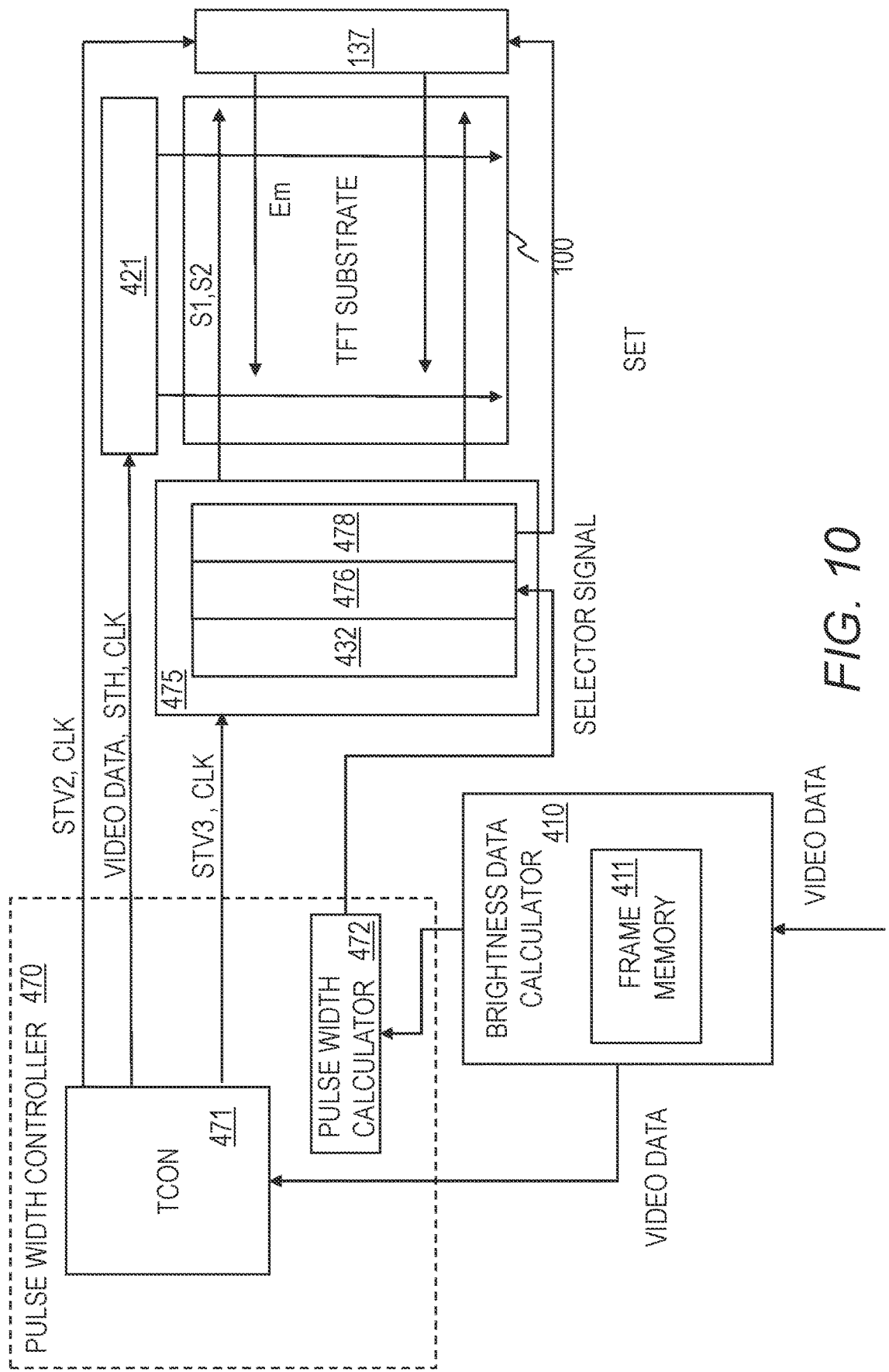
FIG. 10 illustrates an example of the functional configuration of an OLED display device in an embodiment of this specification that dynamically changes the threshold compensation period.

FIG. 10 illustrates an example of the functional configuration of an OLED display device 10 in an embodiment of this specification that dynamically changes the threshold compensation period. In the following, differences from the configuration example illustrated in FIG. 6 are mainly described. The OLED display device 10 includes a scanning driver 475 in place of the scanning driver 131 in FIG. 6. The scanning driver 475 includes a shift register circuit 432, a selector circuit 476, and a latch circuit 478. The details of the scanning driver 475 will be described later with reference to FIG. 11.

The OLED display device 10 includes a pulse width controller 470 in place of the pulse width controller 400 in FIG. 6. The brightness data calculator 410 works in the same manner as the one in the configuration example of FIG. 6. The pulse width controller 470 includes a timing controller (TCON) 471 and a pulse width calculator 472. The OLED display device 10 includes an emission driver 137 in place of the emission driver 132 in FIG. 6.

As described above, the scanning driver 475 does not include the shift register circuit 431 in the scanning driver 131 in FIG. 6. For this reason, the control signals generated and output by the timing controller (TCON) 471 does not include the STV1 start pulse signal in FIG. 6. The other control signals (CLK, STV2, STV3, and STH) generated by the timing controller 471 are the same as those in the configuration example of FIG. 6.

The pulse width calculator 472 acquires the brightness statistic of a video frame from the brightness data calculator 410. The pulse width calculator 472 determines a threshold compensation period based on the acquired brightness statistic. Specifically, the pulse width calculator 472 determines the pulse width for the STV1 start pulse signal that defines the threshold compensation period. As will be described later, the scanning driver 475 outputs a control signal to the selector circuit 476. This specification refers to this control signal as selector signal.

As will be described later, the selector signal specifies one of the control terminals of the selector circuit 476. The scanning driver 475 outputs S1 selection signals having a pulse width associated with the selected control terminal. Selecting a different control terminal leads to generation of S1 selection signals having a different pulse width. The pulse width calculator 472 can determine a threshold compensation period appropriate for the acquired brightness statistic by determining the control terminal to be selected from the selector circuit 476 based on the acquired brightness statistic.

The scanning driver 475 sends SET signals for individual pixel circuit rows to the emission driver 137. The SET signal will be described later. The emission driver 137 generates emission control signals Em for individual pixel circuit rows based on the STV2 signal and the SET signals for individual pixel circuit rows.

Figure 11:
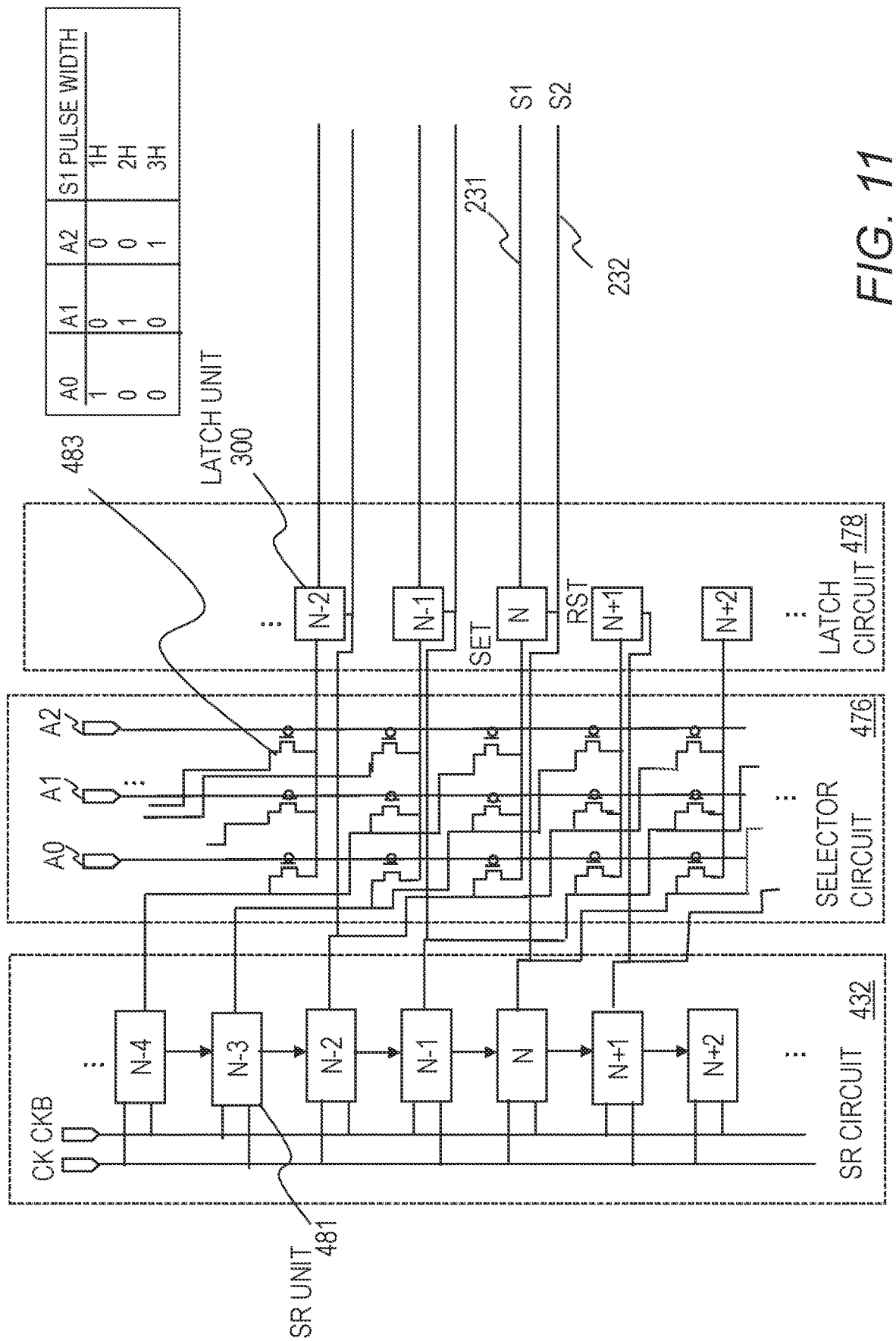
FIG. 11 is a configuration diagram schematically illustrating an internal circuit configuration of a scanning driver.

FIG. 11 is a configuration diagram schematically illustrating the internal circuit configuration of the scanning driver 475. The scanning driver 475 includes a shift register circuit (SR circuit) 432 of the first stage, a selector circuit 476 of the next stage, and a latch circuit 478 of the final stage. The shift register circuit 432 includes a plurality of shift register units 481 connected in series. In FIG. 11, only one of the shift register units is provided with a reference sign 481.

FIG. 11 illustrates the (N−4)th to the (N+2)th shift register units 481 (N is an integer). These shift register units 481 are associated with the (N−4)th to the (N+2)th pixel circuit rows. Each shift register unit 481 outputs an S2 selection signal to the S2 selection signal line 232 of the associated pixel circuit row and further, outputs the same signal to the selector circuit 476 and a latch unit 300 associated with the shift register unit 481.

A data bit is transferred from a shift register unit 481 to the next shift register unit 481 in accordance with the clock signals CK and CKB. The shift register unit 481 holding the data bit outputs a signal pulse.

The latch circuit 478 includes a plurality of latch units 300. In FIG. 11, only one of the latch units is provided with a reference sign 300. FIG. 11 illustrates the (N−2)th to the (N+2)th latch units 300. These latch units 300 are associated with the (N−2)th to the (N+2)th pixel circuit rows and each of them outputs an S1 selection signal to the S1 selection signal line 231 of the associated pixel circuit row.

The selector circuit 476 is disposed between the shift register circuit 432 and the latch circuit 478 to change connection between the shift register units 481 and the latch units 300. The selector circuit 476 has a switch matrix structure including a plurality of switching transistors 483. In FIG. 11, one of the switching transistors is provided with a reference sign 483 by way of example. Although the switching transistors in the example of FIG. 11 are p-type TFTs, the switching transistors can be of either type.

The selector circuit 476 in the configuration example of FIG. 11 includes three switch columns each including switching transistors disposed vertically. The gates of the switching transistors in one switch column are connected to a control terminal A0; the gates of the switching transistors in another switch column are connected to a control terminal A1; and the gates of the switching transistors in the remaining switch column are connected to a control terminal A2. All switching transistor in each switch column are turned ON/OFF together by a potential from one control terminal associated therewith.

One end of the source/drain of each switching transistor 483 connected to the control terminal A0 is connected to the k-th latch unit 300 and the other end is connected to the (k−2)th shift register unit 481 (k is an integer). One end of the source/drain of each switching transistor 483 connected to the control terminal A1 is connected to the k-th latch unit 300 and the other end is connected to the (k−3)th shift register unit 481. One end of the source/drain of each switching transistor 483 connected to the control terminal A2 is connected to the k-th latch unit 300 and the other end is connected to the (k−4)th shift register unit 481.

The switching transistors 483 in a switch column are connected to different latch units 300 and different shift register units 481. Each latch unit 300 is connected from three switching transistors 483 belonging to different switch columns.

Each shift register unit 481 is connected from three switching transistors 483 belonging to different switch columns. Each shift register unit 481 is also connected from the associated latch unit 300. The connected shift register unit 481 and latch unit 300 are assigned the same number. Furthermore, each shift register unit 481 is connected from the S2 selection signal line 232 for the associated pixel circuit row.

The shift register circuit 432 includes shift register units 481 each associated with a pixel circuit row. A shift register unit 481 associated with a pixel circuit row outputs a signal pulse to the associated pixel circuit row and two latch units 300. The number of shift register units 481 is larger than the number of pixel circuit rows. Some of the shift register units 481 are not connected to a pixel circuit row; they output a signal to latch circuits 300 only.

Two input terminals of each latch unit 300 receive output signals of different shift register units 481. Specifically, a signal from the associated (same-numbered) shift register unit 481 is input to an RST terminal. A signal from the shift register unit 481 of an earlier stage selected by the selector circuit 476 is input to a SET terminal. The RST terminal is a first terminal and the SET terminal is a second terminal.

In the configuration example of FIG. 11, the output of the N-th shift register unit 481 is input to the RST terminal of the N-th latch unit 300. The output of the (N−L)th shift register unit 481 selected by the selector circuit 476 (L is an integer greater than 1 and in the example of FIG. 11, 2, 3, or 4) is input to the SET terminal of the N-th latch unit 300.

Figures 12, 13:
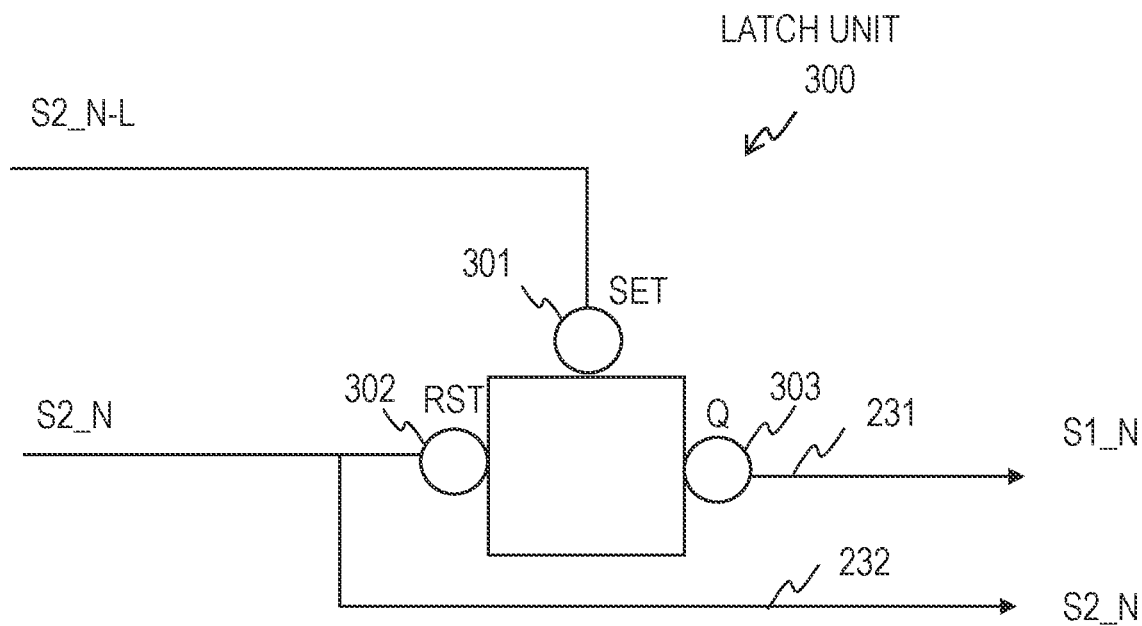
FIG. 12 illustrates a configuration example of a latch unit.
FIG. 13 is a truth table for the latch unit.

FIG. 12 illustrates a configuration example of a latch unit 300. The latch unit 300 outputs an S1 selection signal to the N-th pixel circuit row. The latch unit 300 includes a SET terminal 301 and a RST terminal 302 for receiving a signal and a Q terminal 303 for outputting a signal.

The selection signal S2_N−L for the (N−L)th pixel circuit row is input from the shift register circuit 432 to the SET terminal 301. The selection signal S2_N for the N-th pixel circuit row is input to the RST terminal 302. The latch unit 300 outputs a selection signal S1_N from the Q terminal 303 to the S1 selection signal line 231 for the N-th pixel circuit row.

FIG. 13 is a truth table for a latch unit 300. In the truth table of FIG. 13, L represents a logical Low level and H represents a logical High level. In the configuration described with reference to FIGS. 3 and 7, the High potential levels of the S1 selection signal and the S2 selection signal correspond to the logical Low and the Low potential levels of those signals correspond to the logical High.

When a SET input is L and an RST input is L, the Q output is L. When a SET input is H and an RST input is L, the Q output is H and the Q output is held to be H even if the SET input changes afterwards. When a SET input is L and an RST input is H, the Q output is L. The state where both a SET input and an RST input are H is not allowed.

Figure 14:
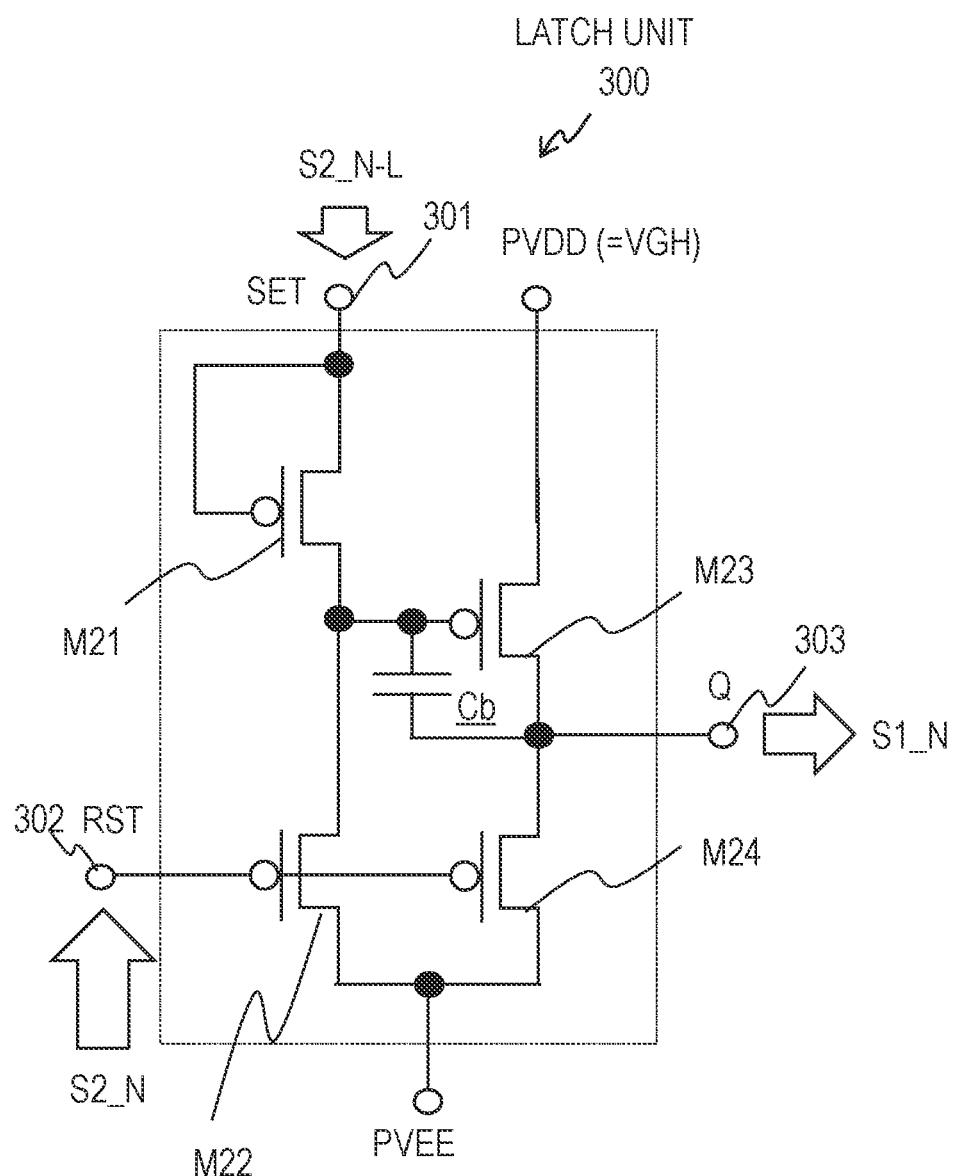
FIG. 14 illustrates an example of the circuit configuration of the latch unit.

FIG. 14 illustrates an example of the circuit configuration of a latch unit 300. In the configuration example of FIG. 14, the latch unit 300 includes four transistors and one capacitive element. The four transistors M21 to M24 are p-type transistors. The transistor M21 is diode-connected and receives an input from the SET terminal 301 at the drain. The transistor M22 is connected between the transistor M21 and the power supply for supplying the power supply potential PVEE and receives an input from the RST terminal 302 at the gate.

The transistor M23 is connected between the power supply for supplying the power supply potential PVDD and the Q terminal 303 and its gate is connected to an intermediate node between the transistors M21 and M22. The transistor M24 is connected between the transistor M23 and the power supply for supplying the power supply potential PVEE and receives an input from the RST terminal at the gate. The capacitive element Cb is connected between the gate of the transistor M23 and the Q terminal 303. An intermediate node between the transistors M23 and M24 is connected to the Q terminal 303.

Returning to FIG. 11, the N-th shift register unit 481 outputs signal pulses simultaneously to the RST terminal of the N-th latch unit 300, the SET terminal of the (N+L)th latch unit 300 selected by the selector circuit 476, and the S2 selection signal line 232 for the N-th pixel circuit row.

The N-th latch unit 300 outputs an S1 selection signal to the N-th pixel circuit row. The N-th latch unit 300 starts a pulse of the S1 selection signal in response to a signal pulse from the (N−L)th shift register unit 481 and ends the pulse in response to a signal pulse from the N-th shift register unit 481.

When one of the control terminals A0, A1 and A2 is selected for the N-th S2 selection signal line 232 and latch unit 300, the associated (N−2)th, (N−3)th, or (N−4)th shift register unit 481 is selected.

More generally, the output of the N-th latch unit 300 is set by a signal pulse from the K-th shift register unit and is reset by a signal pulse from the (K+p)th shift register unit (K is an integer and p is an integer greater than 1). The length of a threshold compensation period is (p−1)*H.

The output of the (N+q)th latch unit 300 is set by a signal pulse from the (K+q)th shift register unit and is reset by a signal pulse from the (K+q+p)th shift register unit (q is an integer greater than 0). The pulse from the latch unit 300 has a pulse width of p*H. The pulse from the (N+q)th latch unit 300 is delayed from the pulse from the N-th latch unit 300 by a time of q*H. The length of a threshold compensation period is (p−1)*H.

The above-described example selects a value for p from 2, 3, and 4 by selecting one of the control terminals A0, A1, and A2 with a selector signal. In other words, the output from the shift register corresponding to the selected p is selected. As described above, an S1 selection signal having a different pulse width or a threshold compensation period having a different length is generated for a different value of p. The combination of selectable values for p is determined depending on the design; it does not need to consist of consecutive natural numbers.

Figure 15:
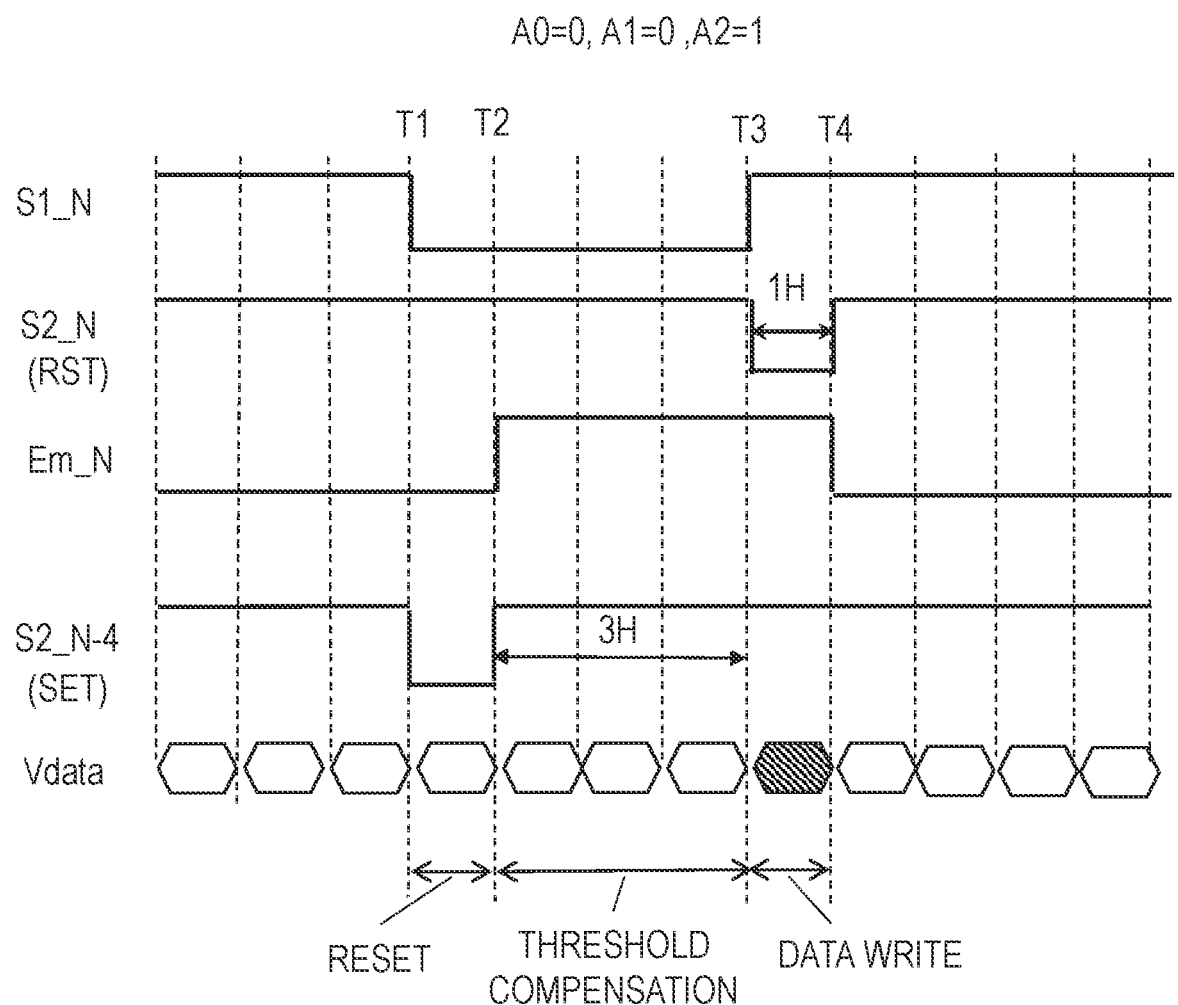
FIG. 15 is an example of the timing chart of the signals for controlling a pixel circuit described with reference to FIGS. 10 to 14.

FIG. 15 is an example of the timing chart of the signals for controlling a pixel circuit 107 described with reference to FIGS. 10 to 14. FIG. 15 is a timing chart to write a threshold compensation voltage for the driving transistor M11 and a data signal Vdata to a pixel circuit 107 in the N-th pixel circuit row.

Specifically, FIG. 15 illustrates temporal variation in one frame period of the selection signals S1_N and S2_N for the N-th pixel circuit row to write the data signal Vdata, the emission control signal Em_N for the N-th pixel circuit row, and the selection signal S2_N−4 for the (N−4)th pixel circuit row. The selection signal S2_N−4 is an example of the output of the shift register unit selected by setting the selector bits as A0=0, A1=0 and A2=1 in the selector circuit 476.

The emission control signal Em_N rises synchronously (simultaneously) with the rise of the SET signal of the N-th latch unit 300. As described above, the emission driver 137 generates an emission control signal based on the input SET signal. In the example of FIG. 15, the selection signal S2_N−4 is the SET signal for the N-th latch unit 300.

In the timing chart of FIG. 15, the period of 1H is a period to write a data signal Vdata to a pixel circuit or a period where the S2 selection signal is Low. A threshold compensation period is not shorter than 1H and in the example of FIG. 15, 3H.

At a time T1, the selection signal S2_N−4 changes from High to Low. In response to the change of the selection signal S2_N−4, the selection signal S1_N changes from High to Low. In response to the change of the selection signal S1_N, the transistors M12, M14, and M16 turn ON. Since the emission control signal Em_N is Low at the time T1, the transistor M15 is ON.

Since the transistors M12, and M14 to M16 are ON, the reset potential Vrst is supplied to the anode of the OLED element E1 and in addition, to the gate of the driving transistor M11. At a time T2, the emission control signal Em_N changes from Low to High. The period from the time T1 to the time T2 is a period to reset the gate voltage of the driving transistor M11. Furthermore, the selection signal S2_N−4 changes from Low to High at the time T2. The period from the time T1 to the time T2 is a period to write a data signal to the (N−4)th pixel circuit row. The period from the time T1 to the time T2 has a length of 1H.

The potential levels of the signals S1_N, S2_N, Em_N, and S2_N−4 are maintained from the time T2 to a time T3. The transistors M12, M14, and M16 are ON and the other transistors including the transistor M15 are OFF. A threshold compensation voltage is written to the storage capacitor C10 during this period from the time T2 to the time T3. The period from the time T2 to the time T3 is a threshold compensation period and has a length of 3H.

At the time T3, the selection signal S2_N changes from High to Low. As will be described later, the selection signal S1_N changes from Low to High in response to the change of the selection signal S2_N. The transistors M12, M14, and M16 turn OFF in response to the change of the selection signal S1_N. The selection signal S1_N is maintained to be High after the time T3.

In response to the change of the selection signal S2_N, the transistor M13 turns from OFF to ON. As a result, a data signal Vdata starts being written to the storage capacitor C10. At a time T4, the selection signal S2_N changes from Low to High. In response, the transistor M13 turns from ON to OFF to end the data write to the N-th pixel circuit row. The period from the time T3 to the time T4 is a period to write data to the N-th pixel circuit row and has a length of 1H. The selection signal S2_N is maintained to be High after the time T4.

At the time T4, the emission control signal Em_N changes from High to Low. In response, the transistor M15 turns from OFF to ON. As a result, driving current is supplied to the OLED element E1 and the OLED element E1 starts emitting light.

As understood from the description with reference to FIGS. 10 to 15, the shift register circuit 432 outputs pulses of the selection signals S2 serially to the pixel circuit rows. The pulse width is 1H. Each latch unit 300 outputs an S1 signal to the associated pixel circuit row.

As described above, when the N-th latch unit 300 receives a pulse of a Low potential level (logical H-level) of the selection signal S2_N-q for the selected preceding row at the SET terminal 301, it alters the selection signal S1_N to be output from the Q terminal 303 into a Low potential level. Although the selection signal S2_N-q subsequently changes to a High potential level (logical L-level), the input S2_N to the RST terminal 302 is at a High potential level and therefore, the selection signal S1_N to be output from the Q terminal 303 is maintained at the Low potential level.

Subsequently, the latch circuit 300 receives a pulse at a Low potential level (logical H-level) of the selection signal S2_N for the N-th pixel circuit row at the RST terminal 302. In response, the latch circuit 300 alters the selection signal S1_N to be output from the Q terminal 303 to a High potential level (logical L-level). The pulse width of the S1_N signal output from the latch circuit 300 is qH.

As described above, using a selector circuit and a latch circuit enables one shift register circuit to generate S1 selection signals and S2 selection signals. Hence, the area required for the circuit for generating the S1 selection signals and the S2 selection signals can be made smaller.

In the foregoing example, the emission driver 137 receives a SET signal generated within the scanning driver 475 and an STV2 signal and generates an emission control signal Em. In another example, the emission driver 137 can include a selector circuit and a latch circuit like the scanning driver 475 and generate emission control signals Em with these circuits.

The above-described example changes the length of the threshold compensation period by shifting the fall of the S1 selection signal and the rise of the emission control signal Em. Another configuration example can change the length of the threshold compensation period by shifting the rise of the S1 selection signal but fixing the emission control signal Em. The rise of the S1 selection signal is controlled by the RST signal to the N-th latch unit.

Embodiment 4

Figure 16:
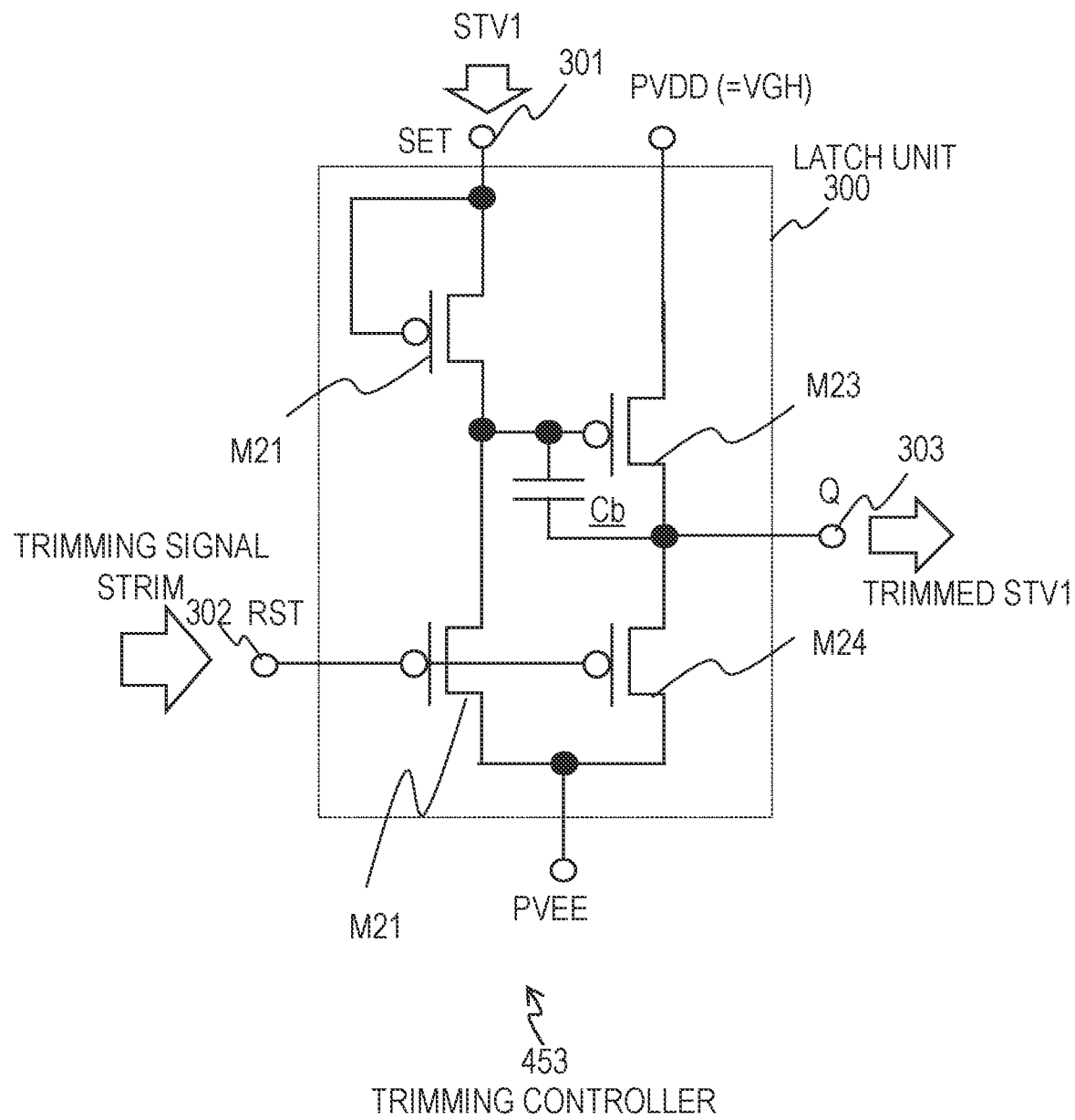
FIG. 16 illustrates a configuration example of a trimming controller.

FIG. 16 illustrates a configuration example of a trimming controller 453. The trimming controller 453 can be implemented with a latch circuit illustrated in FIG. 14. The latch unit 300 in FIG. 16 and the latch unit 300 in FIG. 14 are the same in circuit configuration and different in input and output signals.

As illustrated in FIG. 16, the STV1 signal is input to the SET terminal 301. The trimming signal (STRIM signal) is input to the RST terminal 302. The trimmed STV1 signal is output from the Q terminal 303.

FIG. 17 is a truth table for the trimming controller 453 in FIG. 16. Since the SET terminal 301 and the RST terminal 302 respectively receive the STV1 signal and the STRIM signal as described above, FIG. 17 shows those signals in place of the names of the terminals. In the truth table, L represents a logical Low level and H represents a logical High level. The High potential levels of the STV1 signal and the STRIM signal correspond to the logical Low and the Low potential levels of those signals correspond to the logical High.

Figure 18:
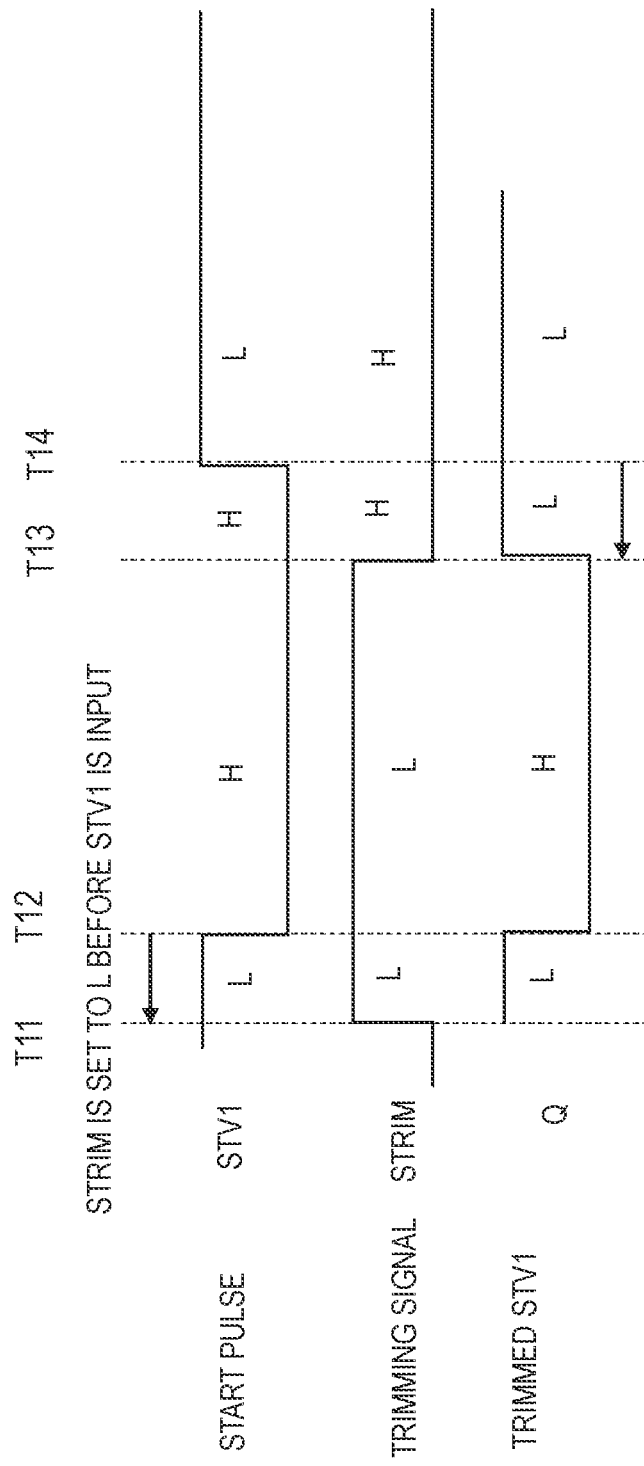
FIG. 18 is a timing chart of input and output signals to and from the trimming controller in FIG. 16.

FIG. 18 is a timing chart of the input and output signals to and from the trimming controller 453. At a time T11, the STRIM signal changes from a logical H-level (Low potential level) to a logical L-level (High potential level). At a subsequent time T12, the STV1 signal and the trimmed STV1 signal change from the logical L-level (High potential level) to a logical H-level (Low potential level).

At a subsequent time T13, the STRIM signal changes from the logical L-level (High potential level) to a logical H-level (Low potential level). In response, the trimmed STV1 signal changes from the logical H-level (Low potential level) to a logical L-level (High potential level). At a subsequent time T14, the STV1 signal changes from the logical H-level (L potential level) to a logical L-level (H potential level).

After passage of an STV1 pulse or later than the time T14, the STRIM signal can be either H or L (Don't Care). The required is that the STRIM signal be set to a logical L-level at any time prior to the time T12 at which the STV1 signal for the next frame is input. Utilizing a simple latch circuits as the trimming controller, the circuits area required for the trimming controller 453 can be minimized.

Embodiment 5

Figures 19, 20:
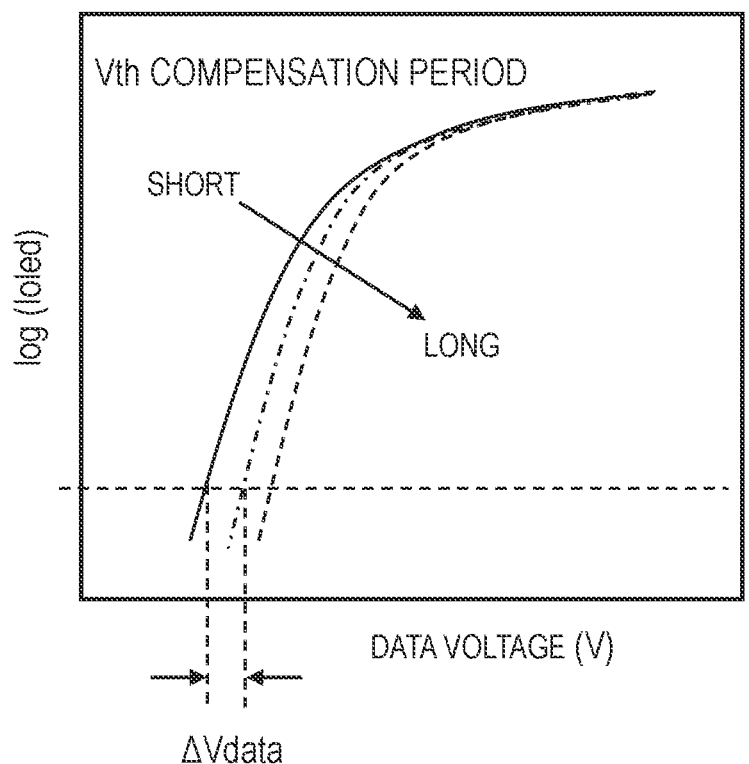
FIG. 19 schematically illustrates relations between data voltage to a pixel circuit and driving current (Ioled) for an OLED element under different threshold compensation periods.
FIG. 20 provides a configuration example of a data voltage adjustment table.

Hereinafter, a technique to reduce the variation in brightness caused by changing the threshold compensation period (Vth compensation period) is described. FIG. 19 schematically illustrates relations between data voltage to a pixel circuit and driving current (Ioled) for an OLED element under different threshold compensation periods. The horizontal axis of the graph of FIG. 19 represents data voltage and the vertical axis represents the log value of the driving current.

As a general characteristic of an OLED pixel circuit having a Vth compensation function, the brightness (the level of the driving current) corresponding to the supplied data voltage varies with the length of the threshold compensation period. Specifically, the brightness decreases as the threshold compensation period becomes longer. This tendency is stronger especially in displaying at lower brightness levels.

Accordingly, the variation in data voltage-brightness characteristic caused by changing the threshold compensation period can be reduced by adjusting the data voltage. An embodiment of this specification prepares a data voltage adjustment table specifying scaled voltage for each selectable threshold compensation period.

FIG. 20 provides a configuration example of a data voltage adjustment table. The data voltage adjustment table includes different threshold compensation periods and scaled voltage for each threshold compensation period. The scaled voltage consists of data voltages corresponding to individual luminous intensity levels. In the configuration example of FIG. 20, luminous intensity levels of 1 to 255 are defined and data voltages are provided for individual combinations of a luminous intensity level and a threshold compensation period.

The control circuit of an OLED display device 10 determines a data voltage to be output from the data driver 421 with reference to the data voltage adjustment table, based on the luminous intensity level specified in video data and the threshold compensation period. As a result, the variation in brightness caused by changing the threshold compensation period can be made small.

Figure 21:
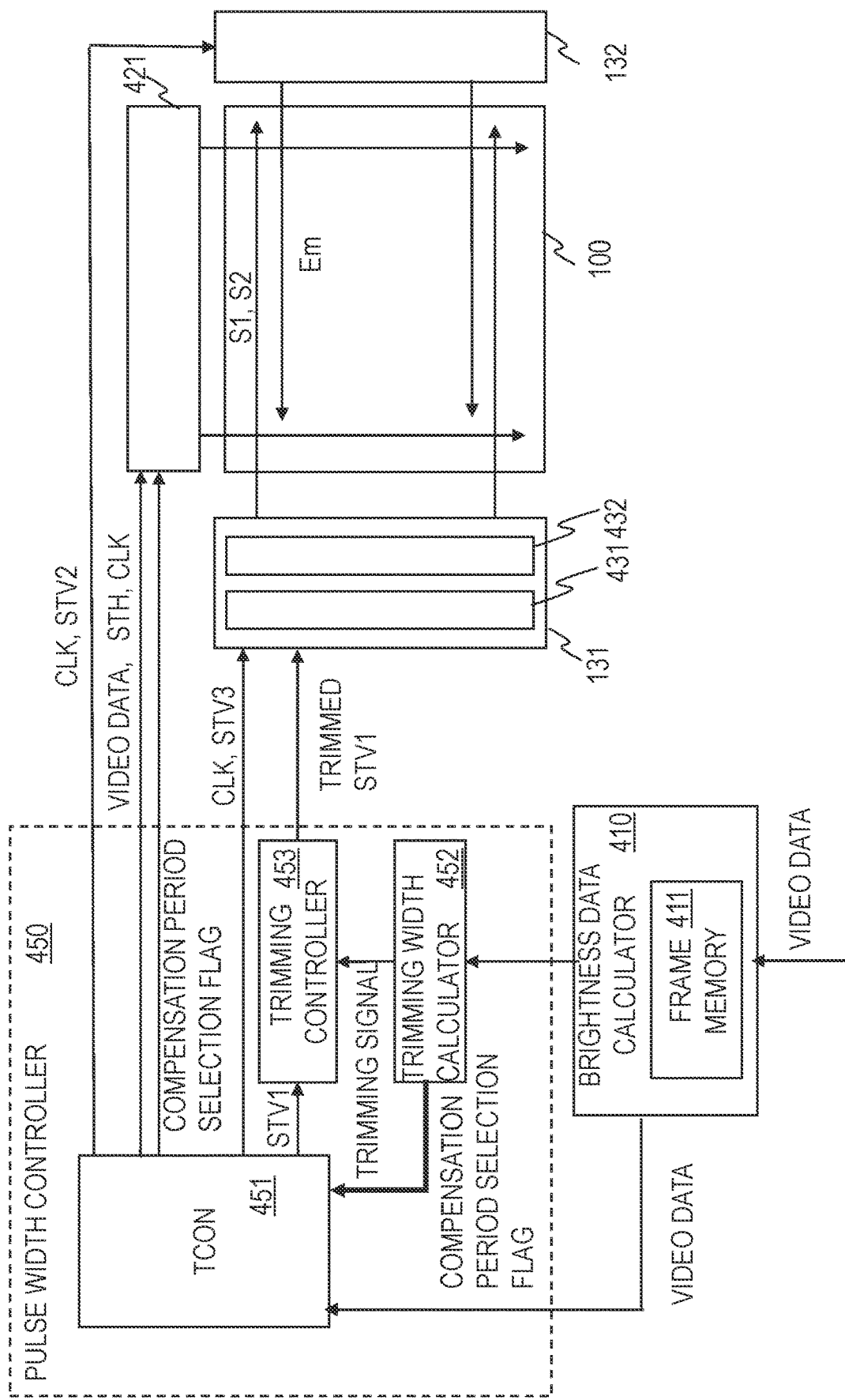
FIG. 21 illustrates an example of the functional configuration of an OLED display device having a function of adjusting data voltage depending on the threshold compensation period.

FIG. 21 illustrates an example of the functional configuration of an OLED display device having a function of adjusting data voltage depending on the threshold compensation period. The following mainly describes differences from the configuration example in FIG. 8. A control flag signal for selecting the optimum threshold compensation period determined by the trimming width calculator 452 is transferred to the data driver 421 through the timing controller 451.

The data driver 421 has the data voltage adjustment table described with reference to FIG. 20. The data driver 421 selects a scaled voltage curve associated with the threshold compensation period indicated by the control flag signal from a plurality of scaled voltage curves in the data voltage adjustment table. The data driver 421 determines a data voltage corresponding to the luminous intensity level calculated from the video data in accordance with the selected scaled voltage curve.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A display device comprising:
a plurality of pixels; and
a control circuit configured to control brightness of the plurality of pixels,
wherein each of the plurality of pixels includes:
a light-emitting element; and
a pixel circuit configured to control light emission of the light-emitting element,
wherein the pixel circuit includes:
a driving transistor configured to supply electric current to the light-emitting element;
a switching transistor having a source and a drain connected between a gate and a drain of the driving transistor; and
a storage capacitor configured to store voltage to control the electric current to be supplied by the driving transistor to the light-emitting element,
wherein the control circuit is configured to:
determine a statistic of brightness of pixels specified by one or more video frames with a predetermined method;
determine a length of a threshold compensation period for which the storage capacitor applies threshold compensation to the driving transistor based on the statistic; and
control an ON period of the switching transistor to control the threshold compensation period in such a manner that the threshold compensation period in a brightness range higher than a predetermined value is shorter than the threshold compensation period in a brightness range no higher than the predetermined value.

2. The display device according to claim 1,
wherein the control circuit includes:
a shift register circuit configured to serially output selection signals to select pixel rows one by one from the plurality of pixels;
a pulse width calculator;
a memory; and
a timing controller,
wherein a pulse width of the selection signals defines a length of the threshold compensation period in a selected pixel row,
wherein the pulse width calculator is configured to:
determine a pulse width of the selection signals to define the threshold compensation period based on the statistic; and
store data specifying the pulse width to the memory,
wherein the timing controller is configured to:
retrieve the data specifying the pulse width from the memory; and
send a start pulse signal having the pulse width specified by the data to the shift register circuit, and
wherein the shift register circuit is configured to output the selection signals having a pulse width equal to the pulse width of the start pulse signal.

3. The display device according to claim 1,
wherein the control circuit includes:
a shift register circuit configured to serially output selection signals to select pixel rows one by one from the plurality of pixels;
a timing controller;
a trimming controller; and
a trimming width calculator,
wherein a pulse width of the selection signals defines a length of the threshold compensation period in a selected pixel row,
wherein the timing controller is configured to output a start pulse signal having a fixed pulse width,
wherein the trimming width calculator is configured to determine a trimming width based on the statistic,
wherein the trimming controller is configured to trim the pulse width of the start pulse signal output from the timing controller by the trimming width, and
wherein the shift register circuit is configured to output the selection signals having a pulse width equal to the trimmed pulse width.

4. The display device according to claim 1,
wherein the control circuit includes:
a shift register circuit including a plurality of shift register units connected to serially output second selection signals to a plurality of pixel rows composed of the plurality of pixels;
a latch circuit including latch units each associated with one of the plurality of pixel rows;
a selector circuit disposed between the latch circuit and the shift register circuit; and
a pulse width calculator,
wherein each shift register unit is configured to output a second selection signal to one pixel row, a first terminal of a latch unit associated with the one pixel row, and the selector circuit,
wherein the pulse width calculator is configured to send a selector signal in accordance with the determined length of the threshold compensation period to the selector circuit,
wherein the selector circuit is configured to output outputs of shift register units selected in accordance with the selector signal to second terminals of the latch units,
wherein each latch unit is configured to output a first selection signal having a pulse width in accordance with the inputs to the first terminal and the second terminal to the associated pixel row, and
wherein the pulse width of the first selection signal defines a length of the threshold compensation period in the pixel row selected by the first selection signal.

5. The display device according to claim 1, wherein the statistic is one of the average, the mode, the highest value, and the lowest value.

6. The display device according to claim 1, wherein the control circuit is configured to determine data voltages corresponding to individual luminous intensity levels depending on the length of the threshold compensation period by consulting a table defining a relation between data voltages and combinations of a luminous intensity level and a length of threshold compensation period.

7. The display device according to claim 3,
wherein the trimming controller includes a second latch unit,
wherein the second latch unit includes a third terminal and a fourth terminal,
wherein the timing controller is configured to output the start pulse signal to the third terminal,
wherein the trimming width calculator is configured to output a trimming signal specifying the trimming width to the fourth terminal, and
wherein the second latch unit is configured to output a start pulse signal whose pulse width is trimmed by the trimming width.

8. A control method for a display device,
the display device including a plurality of pixels each including a light-emitting element and a pixel circuit configured to control light emission of the light-emitting element,
the pixel circuit including a driving transistor configured to supply electric current to the light-emitting element, a switching transistor having a source and a drain connected between a gate and a drain of the driving transistor, and a storage capacitor configured to store voltage to control the electric current to be supplied by the driving transistor to the light-emitting element, and
the control method comprising:
determining a statistic of brightness of pixels specified by one or more video frames with a predetermined method;
determining a length of a threshold compensation period for which the storage capacitor applies threshold compensation to the driving transistor based on the statistic; and
controlling an ON period of the switching transistor to control the threshold compensation period in such a manner that the threshold compensation period in a brightness range higher than a predetermined value is shorter than the threshold compensation period in a brightness range no higher than the predetermined value.

9. The control method according to claim 8,
wherein the display device includes a memory and a shift register circuit configured to serially output selection signals to select pixel rows one by one from the plurality of pixels,
wherein a pulse width of the selection signals defines a length of the threshold compensation period in a selected pixel row,
wherein the control method comprises:

determining a pulse width for the selection signals based on the statistic;

storing data specifying the pulse width to the memory;

retrieving the data specifying the pulse width from the memory;

sending a start pulse signal having the pulse width specified by the data to the shift register circuit; and outputting the selection signals having a pulse width equal to the pulse width of the start pulse signal from the shift register circuit.

10. The control method according to claim 8, wherein the display device includes a shift register circuit configured to serially output selection signals to select pixel rows one by one from the plurality of pixels, wherein a pulse width of the selection signals defines a length of the threshold compensation period in a selected pixel row, wherein the control method comprises:

outputting a start pulse signal having a fixed pulse width;

determining a trimming width based on the statistic;

trimming the pulse width of the start pulse signal by the trimming width;

inputting the start pulse signal having the trimmed pulse width to the shift register circuit; and outputting the selection signals having a pulse width equal to the trimmed pulse width from the shift register circuit.

11. The control method according to claim 8, wherein the display device includes:

a shift register circuit including a plurality of shift register units connected to serially output second selection signals to a plurality of pixel rows composed of the plurality of pixels;

a latch circuit including latch units each associated with one of the plurality of pixel rows;

a selector circuit disposed between the latch circuit and the shift register circuit; and a pulse width calculator, wherein the control method comprises:

outputting, by each shift register unit, a second selection signal to one pixel row, a first terminal of a latch unit associated with the one pixel row, and the selector circuit;

sending, by the pulse width calculator, a selector signal in accordance with the determined length of the threshold compensation period to the selector circuit;

outputting, by the selector circuit, outputs of shift register units selected in accordance with the selector signal to second terminals of the latch units; and outputting, by each latch unit, a first selection signal having a pulse width in accordance with the inputs to the first terminal and the second terminal to the associated pixel row, and wherein the pulse width of the first selection signal defines a length of the threshold compensation period.

12. The control method according to claim 8, wherein the statistic is one of the average, the mode, the highest value, and the lowest value.

13. The control method according to claim 8, further comprising:

determining data voltages corresponding to individual luminous intensity levels depending on the length of the threshold compensation period by consulting a table defining a relation between data voltages and combinations of a luminous intensity level and a length of threshold compensation period.

* * * * *